United States Patent

Terane et al.

[11] Patent Number: 6,091,856
[45] Date of Patent: Jul. 18, 2000

[54] PICTURE ENCODING DEVICE FOR COMPRESSING PICTURE DATA

[75] Inventors: Hideyuki Terane; Hisashi Waki, both of Hyogo, Japan

[73] Assignees: Mitsubishi Electric Semiconductor Software Co., Ltd, Hyogo; Mitsubishi Denki Kabushiki Kaisha, Tokyo, both of Japan

[21] Appl. No.: 08/787,170

[22] Filed: Jan. 23, 1997

[30] Foreign Application Priority Data

Sep. 5, 1996 [JP] Japan ................................. 8-235201

[51] Int. Cl.[7] .............................. G06K 9/36; G06K 9/46; H04N 7/12; H04N 1/41
[52] U.S. Cl. .................. 382/246; 348/384; 348/390; 358/426; 358/427; 358/433; 382/245
[58] Field of Search .......................... 358/261.1, 261.2, 358/261.3, 427, 432, 433, 426; 382/239, 245, 246, 250, 251; 348/384, 387, 390, 405, 420, 408; 341/59, 63, 65, 87

[56] References Cited

U.S. PATENT DOCUMENTS 5,659,362  8/1997  Kovac et al. ............................ 348/384

FOREIGN PATENT DOCUMENTS 5324263  7/1993  Japan .

*Primary Examiner*—Kimberly A. Williams
*Attorney, Agent, or Firm*—Leydig,Voit & Mayer, Ltd.

[57] ABSTRACT

A picture encoding device for compressing picture data using the Huffman encoding system includes a grouping portion for recognizing a group to which an AC coefficient belongs, and a data processing unit receiving a run-length, a group number, and an additional bit, which are output from the grouping portion, for recognizing a ZRL* code and an effective coefficient. If the run-length group number (N/S) is an effective symbol, i.e., not a ZRL* code, the data processing unit transmits the effective symbol to a Huffman encoding portion in the next stage. If the N/S comprises a ZRL* code, a ZRL* code count detection counter is incremented. If an EOB* code follows a ZRL* code, ZRL* codes are deleted in a number corresponding to the count value from the ZRL* code count detection counter. The picture encoding device effectively carries out Huffman encoding without encoding unnecessary ZRL* codes in a Huffman encoding system.

10 Claims, 33 Drawing Sheets

TRUTH VALUE TABLE FOR THREE-INPUT LOGIC CIRCUIT (26~28)

| A | B | C | Y |
|---|---|---|---|
| 0 | 0 | 0 | 0 |
| 0 | 1 | 0 | 0 |
| 1 | 0 | 0 | 0 |
| 1 | 1 | 0 | 0 |
| 0 | 0 | 1 | 1 |
| 0 | 1 | 1 | 0 |
| 1 | 0 | 1 | 1 |
| 1 | 1 | 1 | 1 |

FIG. 4

GROUPING TABLE FOR DIFFERENTIAL VALUE OF DC COEFFICIENT

| GROUP NUMBER S | DC DIFFERENTIAL VALUE | NUMBER OF ADDITIONAL BITS A |
|---|---|---|
| 0 | 0 | 0 |
| 1 | -1, 1 | 1 |
| 2 | -3, -2, 2, 3 | 2 |
| 3 | -7,..., -4, 4,..., 7 | 3 |
| 4 | -15,..., -8, 8,..., 15 | 4 |
| 5 | -31,..., -16, 16,..., 31 | 5 |
| 6 | -63,..., -32, 32,..., 63 | 6 |
| 7 | -127,..., -64, 64,..., 127 | 7 |
| 8 | -255,..., -128, 128,..., 255 | 8 |
| 9 | -511,..., -256, 256,..., 511 | 9 |
| 10 | -1023,..., -512, 512,..., 1023 | 10 |
| 11 | -2047,..., -1024, 1024,..., 2047 | 11 |
| 12 | -4095,..., -2048, 2048,..., 4095 | 12 |
| 13 | -8191,..., -4096, 4096,..., 8191 | 13 |
| 14 | -16383,..., -8192, 8192,..., 16383 | 14 |
| 15 | -32767,..., -16384, 16384,..., 32767 | 15 |

FIG. 29 (PRIOR ART)

CODE TABLE FOR DIFFERENTIAL DC COEFFICIENT

| GROUP NIMBER S | CODE TABLE | CODE WORD |
|---|---|---|
| 0 | 2 | 00 |
| 1 | 2 | 01 |
| 2 | 2 | 10 |
| 3 | 3 | 110 |
| 4 | 4 | 1110 |
| 5 | 5 | 11110 |
| 6 | 6 | 111110 |
| 7 | 7 | 1111110 |
| 8 | 8 | 11111110 |
| 9 | 9 | 111111110 |
| 10 | 10 | 1111111110 |
| 11 | 11 | 11111111110 |

FIG. 30 (PRIOR ART)

GROUPING TABLE FOR AC COEFFICIENT

| GROUP NUMBER S | AC COEFFICIENT | NUMBER OF ADDITIONAL BITS A |
|---|---|---|
| 0 | 0 | 0 |
| 1 | -1, 1 | 1 |
| 2 | -3, -2, 2, 3 | 2 |
| 3 | -7,....,-4, 4,....,7 | 3 |
| 4 | -15,....,-8, 8,....,15 | 4 |
| 5 | -31,....,-16, 16,....,31 | 5 |
| 6 | -63,....,-32, 32,....,63 | 6 |
| 7 | -127,....,-64, 64,....,127 | 7 |
| 8 | -255,....,-128, 128,....,255 | 8 |
| 9 | -511,....,-256, 256,....,511 | 9 |
| 10 | -1023,....,-512, 512,....,1023 | 10 |
| 11 | -2047,....,-1024, 1024,....,2047 | 11 |
| 12 | -4095,....,-2048, 2048,....,4095 | 12 |
| 13 | -8191,....,-4096, 4096,....,8191 | 13 |
| 14 | -16383,....,-8192, 8192,....,16383 | 14 |
| 15 | -32767,....,-16384, 16384,....,32767 | 15 |
| 16 | 32768 | 0 |

FIG. 31 (PRIOR ART)

CODE TABLE OF AC COEFFICIENT
FOR COLOR DIFFERENTIAL COMPONENT

| RUN-LENGTH /SSSS | CODE LENGTH | CODE WORD |
|---|---|---|
| 0/0 (EOB*) | 2 | 00 |
| 0/1 | 2 | 01 |
| 0/2 | 3 | 100 |
| 0/3 | 4 | 1010 |
| ⋮ | ⋮ | ⋮ |
| 1/1 | 4 | 1011 |
| 1/2 | 6 | 111001 |
| 1/3 | 8 | 11110110 |
| ⋮ | ⋮ | ⋮ |
| 3/2 | 8 | 11111000 |
| ⋮ | ⋮ | ⋮ |
| 4/1 | 6 | 111010 |
| 4/2 | 9 | 111110110 |
| 4/3 | 16 | 1111111110010111 |
| 4/4 | 16 | 1111111110011000 |
| ⋮ | ⋮ | ⋮ |
| 4/A | 16 | 1111111110011110 |
| ⋮ | ⋮ | ⋮ |
| F/0 (ZRL*) | 10 | 1111111010 |
| ⋮ | ⋮ | ⋮ |
| F/A | 16 | 1111111111111110 |

FIG. 32 (PRIOR ART)

PICTURE ENCODING DEVICE FOR COMPRESSING PICTURE DATA

BACKGROUND OF THE INVENTION

1. Field of the Invention

The present invention relates to a device for effectively processing a run-length consisting of null coefficients (i.e., the content in a data block is 0) of a Huffman encoding system in an entropy encoding portion of a picture encoding device.

2. Description of the Prior Art

FIG. 22 is a block diagram showing a conventional picture encoding device comprising an input terminal 1 to which picture data consisting of 8×8 pixel blocks is inputted, a discrete cosine conversion portion (DCT) 2, a zigzag conversion portion 3, a quantization portion 4, a quantization table 5, an entropy encoding portion 6, an encoding table 7, and an output terminal 8 from which parameter and encoded data are outputted.

The operation of the conventional picture encoding device is now explained. First, picture data is inputted from the picture data input terminal 1, for example, in a form of an 8-bit-length component picture $P_{xy}$ (x, y=0, 1, 2, 3 ..., 7). The inputted picture data is transmitted to the discrete cosine conversion portion 2, where a two-dimensional discrete cosine conversion is carried out on each of the divided 8×8 pixel blocks $P_{xy}$. As a result of the two-dimensional discrete cosine conversion, sixty-four (=8×8) coefficients $S_{UV}$ are obtained. The sixty-four DCT coefficients $S_{UV}$ obtained as a result of the two-dimensional discrete cosine conversion are inputted into the quantization portion 4, where each DCT coefficient $S_{UV}$ is divided by the value $Q_{UV}$ in the quantization table 5. The quantized sixty-four coefficients $R_{UV}$ are transmitted to the zigzag conversion portion 3 where serial-order coefficients are permuted into a zigzag order. The zigzag-order sixty-four coefficients $R_{UV}$ are then transmitted to the entropy encoding portion 6 where the sixty-four coefficients are encoded according to a Huffman encoding system, using the encoding table 7. Then, the encoded data is outputted in a certain byte unit (for example, 16 bits in length) from the output terminal 8.

The two-dimensional discrete cosine conversion is carried out on a component picture $P_{xy}$ (x, y=0, 1, 2, 3 ..., 7) consisting of 8×8 pixels inputted into the input terminal 1 in the DCT 2. As a result, components $S_{UV}$ as shown by equation (1) are obtained.

$$S_{UV} = \frac{1}{4} C_U C_V \sum_{x=0}^{7} \sum_{y=0}^{7} (P_{xy} - Ls)\cos\frac{(2x+1)u\pi}{16}\cos\frac{(2y+1)v\pi}{16}$$

where x, y=the position of a pixel in a block u, v=the position of a DCT coefficient $$C_u C_v = \frac{1}{\sqrt{2}} : u, v = 0$$

$Ls = 1$ : others
$\quad\; = 128$ : bit accuracy of $P_{xy}$ = 8 bits
$\quad\; = 2048$ : = 12 bits As shown in FIG. 23, the DCT coefficients $S_{UV}$ consist of $S_{00}$, a DC (direct current) component, and of $S_{01}$–$S_{77}$ AC (alternate current) components. The coefficient $S_{00}$ is the largest component and the AC components have a very small value compared with the $S_{00}$ coefficient.

The DCT coefficient $S_{UV}$ is inputted into the quantization portion 4. The DCT coefficients $S_{UV}$ are divided using the value $Q_{UV}$ in the quantization table 5 in the quantization portion 4. In other words, the quantized DCT coefficients $R_{UV}$ are derived from the following equation.

$$R = \text{round}(S_{UV}/Q_{UV})$$

The round function converts the calculated result of $S_{UV}/Q_{UV}$ to the closest integer. Accordingly, by setting the value $Q_{UV}$ in the quantization table so that the two-dimensional numbers U and V become large in proportion to the value of U and V, respectively, most of the AC coefficients become 0 when the degree is large.

The operation of the entropy encoding portion 6, which is a characteristic of a picture encoding device, is explained in detail. In FIG. 22, sixty-four coefficients $R_{UV}$ comprising a DC coefficient ($R_{00}$) and the AC coefficients (except $R_{00}$), outputted from the quantization portion 4, are transmitted to the entropy encoding portion 6 via the zigzag conversion portion 3. In the entropy encoding portion 6, a different encoding system is applied to the DC coefficient ($R_{00}$), representing a mean value of 8×8 pixels, and the AC coefficients (except $R_{00}$), respectively. The following explanation is given with respect to these different encoding systems.

FIG. 24 is a block diagram for grouping the DC coefficient $R_{00}$. In FIG. 24, a DC differentiator 62 carries out a subtraction to derive a difference between the DC coefficient $R_{00}$, inputted from the quantization portion 4, and a preceding DC coefficient $R_{00}$, delayed by a block delay portion 61. The difference is transmitted to the grouping unit 9. As FIG. 25 shows, the difference between the DC coefficient ($DC_i$) for a block (i) of the current DC component (for example, one of R, G, B in case of a color signal) and the DC coefficient ($DC_{i-1}$) for a block (i-1) of the corresponding component encoded just before the block (i) is calculated by the DC differentiator 62, as a differential value ($\Delta DC_i=(DC_i)-(DC_{i-1})$). Since the mean value between two adjacent blocks does not change significantly often, except in some peculiar cases such as computer graphics, the differential value between the current DC coefficient and the preceding DC coefficient converges around zero. Accordingly, by encoding such differences calculated in this way, highly-efficient encoding is achieved.

The differential value of the DC coefficient calculated by the DC differentiator 62 is inputted to the grouping unit 9, where the group to which the differential value belongs is obtained, using the table of FIG. 29. The output from the grouping unit 9 represents the DC coefficient by a group number (S) and an additional bit (A). The additional bit (A) is a value indicating the order of the differential value in the group. In group 3 of FIG. 29, for example, the number of additional bits is three, and the DC differential value takes one of the following eight values, -7, -6, -5, -4, 4, 5, 6, 7, to which respective additional bits 000, 001, 010, 011, 100, 101, 110, 111 are allotted. In this way, the grouping unit 9 outputs the group number (S) and the additional bit (A). For example, if a DC coefficient is four, the value of the group number (S) is three (0011 in binary), and the value of the additional bit is four (0100 in binary) according to the table of FIG. 29. This group number (S) and the additional bit (A), the outputs from this grouping unit 9, are encoded by a one-dimensional Huffman encoding portion 65 in FIG. 28. The value of the group number (S) is referred to as DC* in the following description.

FIG. 26 is a block diagram showing a grouping of AC coefficients. The AC coefficients are permuted into a one-dimensional order, for example, $AC_{01}$, $AC_{10}$, $AC_{20}$ ..., $AC_{75}$, $AC_{66}$, $AC_{77}$ by a zigzag scanning portion 91. $AC_{01}$ represents an AC value with zigzag coordinates (0, 1). FIG. 27 is a diagram showing how zigzag scanning is carried out. Each of the AC coefficients permuted into one-dimensional order by the zigzag scanning portion 91 is determined in the judgement portion 92 to be zero or other than zero. If the AC coefficient is zero, the continuous number of zeros in the AC coefficient is counted in the run-length counter 93, and the count is outputted as a run-length (N). For example, if an AC coefficient comprises five continuous zeros, the run-length (N) is five (0101 in binary), and if an AC coefficient comprises fourteen continuous zeros, the run-length (N) is fourteen (1110 in binary).

If the AC coefficient is other than zero, the grouping portion 94 in FIG. 26 generates a group number (S) and an additional bit (A) by the same method as a DC coefficient is calculated. A group to which an AC coefficient belongs is determined according to the table of FIG. 31. The additional bit (A) is a value indicating the order of the AC coefficient in the group. For example, if an AC coefficient is fifteen, the group number is four. In group 4, the number of additional bits is four; in other words, the AC coefficient which belongs to the group 4 may take any one of the sixteen values of −15, −14 ..., −8, 8, 9 ..., 14, 15, which are represented by four bits. The additional bits 0000, 00001 ..., 1110, 1111 are allotted to −15, −14 ..., 14, 15, respectively. In this way, the group number (S) and the additional bit (A) are outputted from the grouping portion 94. Accordingly, the additional bit (A) for the AC coefficient 15 is fifteen (1111 in binary).

The group number (S), outputted from the grouping portion 94, and the run-length (N), outputted from the run-length counter 93, are Huffman-encoded by a two-dimensional Huffman encoding portion 95 and an AC encoding table portion 96 in the Huffman encoding portion 12, as explained below.

FIG. 28 is a block diagram showing a circuit for carrying out grouping and Huffman encoding on the DC coefficient and the AC coefficients. In FIG. 28, the DC grouping unit 9a is the same as in FIG. 24, and the AC grouping unit 9b is the same as in FIG. 26.

The operation of the Huffman encoding portion 12 is explained briefly. In FIG. 28, a one-dimensional Huffman encoding portion 65, a DC encoding table portion 66, and a DC additional bit coupling portion 67 constitute an encoding portion for DC coefficients, and two-dimensional Huffman encoding portions 95, an AC encoding table portion 96, and AC additional bit coupling portion 97 constitute an encoding portion for AC coefficients. A DC encoding signal and an AC encoding signal are coupled in a coupling circuit 68.

The encoding of a DC coefficient is explained below. The group number (S) (DC*) and the additional bit (A) are obtained in the DC grouping unit 9a. The group number (S) is encoded in the one-dimensional Huffman encoding portion 65, which carries out one-dimensional Huffman encoding on the group number (S) using a DC encoding table in the DC encoding table portion 66. The DC code (simply referred to as DC below) is then outputted.

FIG. 30 is a diagram showing an example of one-dimensional Huffman encoding. For example, if the group number (S)=4 is inputted into a one-dimensional Huffman encoding portion 65, the encoded DC code is 1110 after the one-dimensional Huffman encoding is carried out. The output 1110 from the one-dimensional Huffman encoding portion 65 is coupled with the additional bit 100 from the grouping unit 9a in the DC additional coupling portion 67 and becomes 1110100 (DC code+additional bits). As shown in FIG. 30, in a Huffman encoding system, since a signal can be transmitted by fewer code bits if the DC differential value is smaller, the transmission of a signal with a small DC differential value is highly efficient.

The encoding of AC coefficients is explained below. In FIG. 28, the group number (S) from the grouping unit 9b and a run-length (N) from the run-length counter 93 are encoded by the two-dimensional Huffman encoding portion 95 and the AC encoding table 96 in the Huffman encoding portion 12, where Huffman encoding is carried out on the group number (S) and the run-length (N). An additional bit (A) is added to the encoded value in the AC additional bit coupling portion 97, and then an encoded AC code is outputted. The two-dimensional encoding is explained in the following specific example.

Referring to FIG. 33, the operation is explained in respect to an example when sixty-four block signals are inputted into a circuit shown in FIG. 28, wherein the sixty-four bit signals include a DC coefficient ($R_{00}$) having the differential value of four, outputted from the zigzag conversion portion 3 in FIG. 22, an AC coefficient ($R_{UV}$) which includes four null coefficients of zero value, one AC coefficient (AC 1, value=10), sixteen null coefficients of zero value, three null coefficients of zero value, one AC coefficient (AC 2, value= 3), and thirty-eight null coefficients of zero value.

The DC coefficient is grouped in the grouping unit 9a and outputted as a group number (S). The value of the group number (S) is referred to as DC* below. In this example, since the differential value is assumed to be four, the group number (S) is three, the number of the additional bits is three, and the number of the additional bits (A)=100, according to FIG. 29. This group number (S)=3 and the number of additional bits (A)=100 are encoded, and a one-dimensional Huffman-encoded signal="01101001", i.e., code word (=110)+the number of the additional bit (A)=100, is obtained.

On the other hand, each of the AC coefficients is grouped one by one in the grouping unit 9b, and the run-length (N), which indicates the length of a continuous number of zero coefficients, and the group number (S) following the run-length (N), which indicates the size of a coefficient value except zero, are coupled and encoded by the two-dimensional Huffman encoding portion 95 and the AC encoding table 96. The encoded two-dimensional Huffman code is added to the additional bit and outputted from the AC additional bit coupling portion 97.

In this example, four null coefficients of zero value are inputted as a run-length (N=4) into the two-dimensional Huffman encoding portion 95. The next AC coefficient, AC1 (value 10), is also inputted into the two-dimensional Huffman encoding portion 95. Since the value of the AC coefficient is ten, the group number (S) is four according to FIG. 31. Since the value ten of the effective coefficient is ranked 11th from the smallest, the additional bit is 1010. In the two-dimensional Huffman encoding, as described above, since the null coefficient (N) is four and the group number (S) is four, N/S is 4/4. Accordingly, two-dimensional Huffman encoding is carried out using an AC encoding table portion 96 (FIG. 32), which corresponds to N/S (4/4) in the two-dimensional Huffman encoding portion 95 in the Huffman encoding portion 12. After the additional bit is added, a two-dimensional Huffman encoding signal "1111111100110001010" is obtained.

The next sixteen null coefficients are counted by the run-length counter 93, and a count value of fifteen (1111 in binary) is outputted. This count value fifteen and the next zero value are encoded by the two-dimensional Huffman encoding portion 95, and a ZRL* is outputted. Since this ZRL* comprises a combination of a run-length (N) of fifteen and an effective coefficient of zero, an N/S signal is F/O, and an encoded signal ZRL="1111111010" is obtained from the AC encoding table of FIG. 32.

According to FIG. 31, the run-length (N) for the portion comprising three null coefficients and one AC2 (value=3) is three, the group number (S) is two, and the additional bit is three (11 in binary). Accordingly, the N/S signal is 3/2, and an encoded signal "11111000" is obtained from the AC encoding table of FIG. 32, which is outputted from the two-dimensional Huffman encoding portion 95. This encoded signal "11111000" is coupled with an additional bit in the AC additional bit coupling portion 97, and outputted as "1111100011".

In case the number of null coefficients is thirty-eight, since one ZRL* is allotted for every continuous number of sixteen null coefficients, two ZRL*s are continuously outputted from the two-dimensional Huffman encoding portion 95. As seen from the AC encoding table of FIG. 32, two encoded signals ZRL "111111010" for the respective two ZRL*s are continuously outputted. Since thirty-two zeros are used for two ZRL*s, an EOB* is allotted for the remaining six zeros. The EOB* code is a code which is outputted from the grouping unit 9 immediately after the code for the last effective coefficient, when the last AC coefficient $AC_{77}$ is zero. This EOB* code is represented, for example, by "00" in binary as shown in the AC encoding table of FIG. 32.

The group number (S) designates the group to which an effective coefficient belongs, as described above, and an additional bit is used to indicate a specific value in the group. If the last AC coefficient ($AC_{77}$) in the block is zero, an EOB* (End of Block) code is added immediately after the code for the last effective coefficient so that encoding of the block is completed. If the last AC coefficient ($AC_{77}$) in the block is other than zero, no EOB* code is added. In the case of the run-length consisting of at least sixteen null coefficients, a ZRL* (Zero Run Length) code, indicating sixteen null coefficients in continuous number is outputted successively until the number of the null coefficients in the run-length becomes less than or equal to fifteen, and the remaining run-length N is then encoded. In a Huffman encoding system, encoding is carried out so that as many ZRL* codes are generated as possible so that a picture signal is compressed. Therefore, after the compression, the ZRL* code must be deleted. That is, in an entropy encoding portion of a conventional picture encoding device, if more than sixteen continuous null coefficients are received, multiple ZRL* codes are outputted. After the ZRL* codes are outputted, if an EOB* code is outputted, corresponding to null coefficients without an effective coefficient, ZRL* codes that have already been outputted should be deleted.

However, since the ZRL* codes have been already grouped and transmitted to the next stage, deletion of such ZRL* codes is difficult. Moreover, unnecessary ZRL* codes between an effective coefficient and an EOB* are dealt with as codes and Huffman-encoding is carried out on the unnecessary ZRL* codes, making the encoding efficiency worse. In order to avoid dealing with the unnecessary ZRL* codes, encoding processing of the ZRL* codes should be stopped before the Huffman encoding, retarding encoding processing speed.

The object of the present invention is to provide a picture encoding device for effectively deleting the ZRL* codes outputted before the EOB* code and before Huffman encoding.

SUMMARY OF THE INVENTION

According to one aspect of the invention, an picture encoding device for compressing picture data comprises a cosine conversion portion for carrying out a discrete cosine conversion for every pixel block, a quantization portion for carrying out a linear quantization on a discrete-cosine-converted coefficient in a step size corresponding to a position of the coefficient, a zigzag conversion portion for permuting serial-order block data into zigzag-order, and an entropy encoding portion comprising a grouping portion for determining which group a permuted AC coefficient value belongs to, the entropy encoding portion carrying out entropy encoding using a Huffman encoding system according to run-length, group number, and an additional bit outputted from the grouping portion.

The entropy encoding portion comprises the grouping portion and a data processing unit, the data processing unit comprises a ZRL* encoding detection circuit for detecting a ZRL* code, an EOB* code detection circuit for detecting an EOB* code, a ZRL* code count detection counter for counting the number of the ZRL* code detected in the ZRL* code detection circuit, data-transmission storage devices, and enable-signal-transmission storage devices.

If the run-length group number (N/S) is an effective symbol (except the ZRL* code), the effective symbol is transmitted to a Huffman encoding portion in the next stage via the data-transmission storage devices.

If N/S comprises a ZRL* code, the ZRL* code detection circuit increments the ZRL* code count detection counter.

If the ZRL* code is followed by an EOB* code, ZRL* codes are in a number corresponding to the count value of the ZRL* code count detection counter.

According to another aspect of the invention, the data processing unit in the picture encoding device further comprises a decoder for generating a control signal from a value of the ZRL* code detection counter.

If N/S comprises a ZRL* code, the decoder decodes the number of the ZRL* codes incremented by the ZRL* code detection circuit, and the ZRL* codes stored in the data-transmission storage devices, corresponding to the decoded value, are deleted.

According to a further aspect of the invention, the data processing unit in the picture encoding device comprises a plurality of three-input logic circuits and a two-input AND circuit. The two-input AND circuit is provided an output from the EOB* encode detection circuit and an output from the ZRL* encoding detection circuit, delayed by one-clock.

The three-input logic circuit is provided a corresponding output from the decoder and an output from the two-input AND circuit.

If N/S comprises more than one ZRL* code and the EOB* code, the number of ZRL* codes incremented by the ZRL* code detection circuit is decoded in the decoder, a signal corresponding to the decoded value and an output from the two-input AND circuit are inputted to the three-input logic circuits, and the data-transmission storage devices and the enable-signal-transmission storage devices are reset in response to an output from the three-input logic circuit, whereby the ZRL* codes inputted before the BOB* code are deleted.

According to a further aspect of the invention, the entropy encoding portion comprises an address control unit, in addition to the data processing unit, and a storage device between the data processing unit and a Huffman encoding portion; and the address control unit writes an EOB* code into an address in the storage device. The address is determined by subtracting the number of ZRL* codes detected in the ZRL* code count detection circuit from the current address, whereby the ZRL* codes are deleted.

According to still another aspect of the invention, the address control unit in the picture encoding device comprises a load counter and a subtractor; and the ZRL* code which is supposed to be stored in the storage device is replaced with an EOB* code, and the ZRL* code is deleted in an address generation circuit comprising the load counter and the subtractor, by subtracting a count value from the ZRL* code count detection counter based on a write-in address WA in the storage device, if N/S comprises a ZRL* code.

According to yet a further aspect of the invention, the address control unit in the picture encoding device further comprises a first delay-adjustment flip-flop for delaying a ZRL* code, a second delay-adjustment flip-flop for delaying an output of the ZRL* code count detection counter, and a two-input AND circuit. If an output of the two-input AND circuit is logical "H", the two-input AND circuit is provided with two signals, one signal being produced by delaying an output of the ZRL* code detection circuit by the first delay-adjustment flip-flop, and the other signal being an output of the EOB* code detection circuit.

An address generation circuit comprises the load counter and the subtractor decrements the write-in address WA in the storage device by the count value from the ZRL* code count detection counter, whereby the ZRL* code to be stored in the storage device is replaced by an EOB* code, and thereby the ZRL* code is deleted.

According to a still further aspect of the invention, the zigzag conversion portion comprises a buffer, a write-in counter for generating an address value to write a data block in the buffer, a read-out counter for generating an address value to read out from the buffer, a zigzag address converter for converting serial-order values of the read-out counter into zigzag-order, a selector for switching between a read-out address and a write-in address of the buffer, a first zero detection circuit for detecting the number of zero data to be written into the buffer, a second zero detection circuit for detecting the number of zero data to be read out from the buffer, and an EOB* judgement circuit for judging a last effective coefficient in the pixel block in response to the number of first zero detection circuits and the number of second zero detection circuits.

The number of zero data in the pixel block when a data block is written into the buffer in serial order is compared with the number of zero data in the pixel block when the data is read out from the buffer in zigzag order. If the resultant value matches the number of pixel data blocks remaining in the buffer, a signal indicating that an output code from the buffer is the last efficient coefficient in the pixel block is outputted.

According to another aspect of the invention, the first zero detection circuit counts the number of zero data in every pixel block when the data block is serially written into the buffer, the second zero detection circuit counts the number of zero data when the contents of the buffer are read out in zigzag order, the EOB* judgement circuit compares the number of zero data counted in the first zero detection circuit with the number of zero data counted in the second zero detection circuit. If a resultant value matches the number of pixel data blocks remaining in the buffer, the EOB* judgement circuit outputs a signal indicating that an output code from the buffer is the last efficient coefficient in the pixel block.

According to a further aspect of the invention, the buffer, the write-in counter for generating an address value to write a data block in the buffer, the read-out counter for generating an address value to read out from the buffer, the zigzag address converter for converting serial-order values of the read-out counter into zigzag-order, and the selector for switching between a read-out address and a write-in address of the buffer are duplicated, respectively.

The first zero detection circuit for detecting the number of zero data to be written into the buffer, the second zero detection circuit for detecting the number of zero data to be read out from the buffer, and the EOB* judgement circuit for judging a last effective coefficient in the pixel block in response to the number of the first zero detection circuits and the second zero detection circuits are shared, and outputs from the duplicated buffers, namely, from the first buffer and the second buffer, are connected in common.

A data block is read out from the second buffer in zigzag order when a data block is written into the first buffer in serial order, and a data block is read out from the first buffer in zigzag order when a data block is written into the second buffer in serial order.

The number of zero data in the pixel block when a data block is written into the buffer in serial order and the number of zero data in the pixel block when the data is read out from the buffer in zigzag order are compared. If the resultant value matches the number of pixel data blocks remaining in the buffer, each duplicated circuit independently outputs a signal indicating that an output code from the buffer is the last efficient coefficient in the pixel block.

According to a yet another aspect of the invention, the first zero detection circuit counts the number of zero data in every pixel block during a first cycle when a data block is serially written into the first buffer, and the first zero detection circuit also counts the number of zero data in every pixel block during a second cycle when a data block is written into the second buffer in serial order.

The second zero detection circuit counts the number of zero data read out from the second buffer when the content of the second buffer is read out during a first cycle, and the second zero detection circuit also counts the number of zero data read out from the first buffer when the content of the first buffer is read out in zigzag order during a second cycle.

The EOB* judgement circuit compares the number of zero data counted in the first zero detection circuit with the number of zero data counted in the second zero detection circuit. If a resultant value matches the number of pixel data blocks remaining in the buffer, the EOB* judgement circuit outputs a signal indicating that an output code from the buffer is the last efficient coefficient in the pixel block.

According to an aspect of the invention, the buffer comprises a two port single buffer, wherein an already written-in pixel data block is read out in zigzag order from a second port of the single buffer when the data block of the pixel block is written into a first port of the single buffer in serial order during a first cycle, and an already written-in pixel data block is read out in zigzag order from the first port of the single buffer when the data block of the pixel block is written into the second port of the single buffer in serial order during a second cycle.

The number of zero data in the pixel block when a data block is written into the single buffer in serial order is compared with the number of zero data in the pixel block when the data is read out from the single buffer in zigzag order. If the resultant value matches the number of pixel data blocks remaining in the single buffer, a signal indicating that an output code from the single buffer is the last efficient coefficient in the pixel block is outputted from each corresponding port.

According to a further aspect of the invention, the first zero detection circuit counts the number of zero data in every pixel block during a first cycle when a data block is written into a first port of the single buffer in serial order, and the first zero detection circuit also counts the number of zero data in every pixel block during a second cycle when a data block is written into a second port of the single buffer in serial order.

The second zero detection circuit counts the number of zero data when the content in the first port is read out in zigzag order during a cycle which is one-half cycle shifted from the first cycle, and the second zero detection circuit also counts the number of zero data when the content in the second port is read out in zigzag order during a cycle which is one-half cycle shifted from the second cycle.

The EOB* judgement circuit compares the number of zero data counted in the first zero detection circuit with the number of zero data in the pixel block when the data is read out in zigzag order from the single buffer. If the resultant value coincides with the number of pixel block data remaining in the single buffer, the EOB* judgement circuit outputs a signal on each corresponding port indicating that an output code from the single buffer is a last coefficient in the pixel block on each corresponding port.

BRIEF DESCRIPTION OF THE DRAWINGS

FIG. 4 is a diagram showing a truth value table for a three-input logic circuit shown in FIG. 3.

FIG. 29 is a diagram showing a grouping table for grouping a differential value of DC coefficients in a conventional picture encoding device.

FIG. 30 is a diagram showing a code table for carrying out differential encoding of a DC coefficient in a conventional picture encoding device.

FIG. 31 is a diagram showing a grouping table for grouping a differential value of an AC coefficient in a conventional picture encoding device.

FIG. 32 is a diagram showing a code table for encoding an AC coefficient in a conventional picture encoding device.

DESCRIPTION OF THE PREFERRED EMBODIMENTS

Embodiment 1

Figure 1:
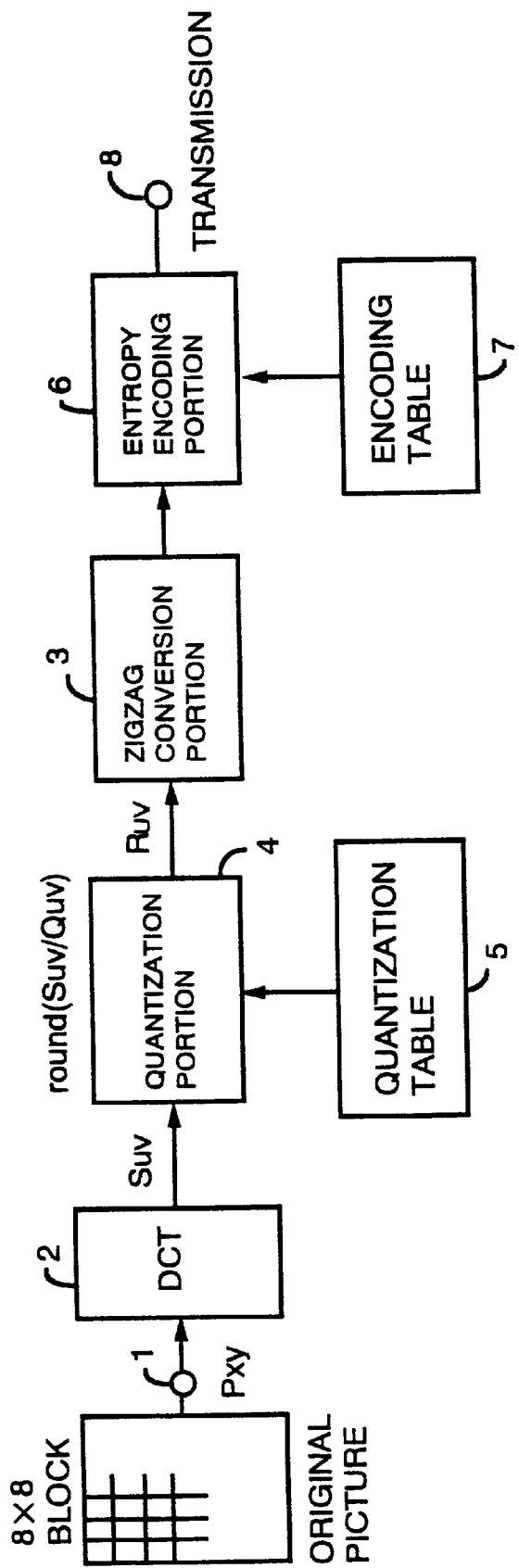
FIG. 1 is a block diagram showing a picture encoding device according to the present invention.
Figure 2:
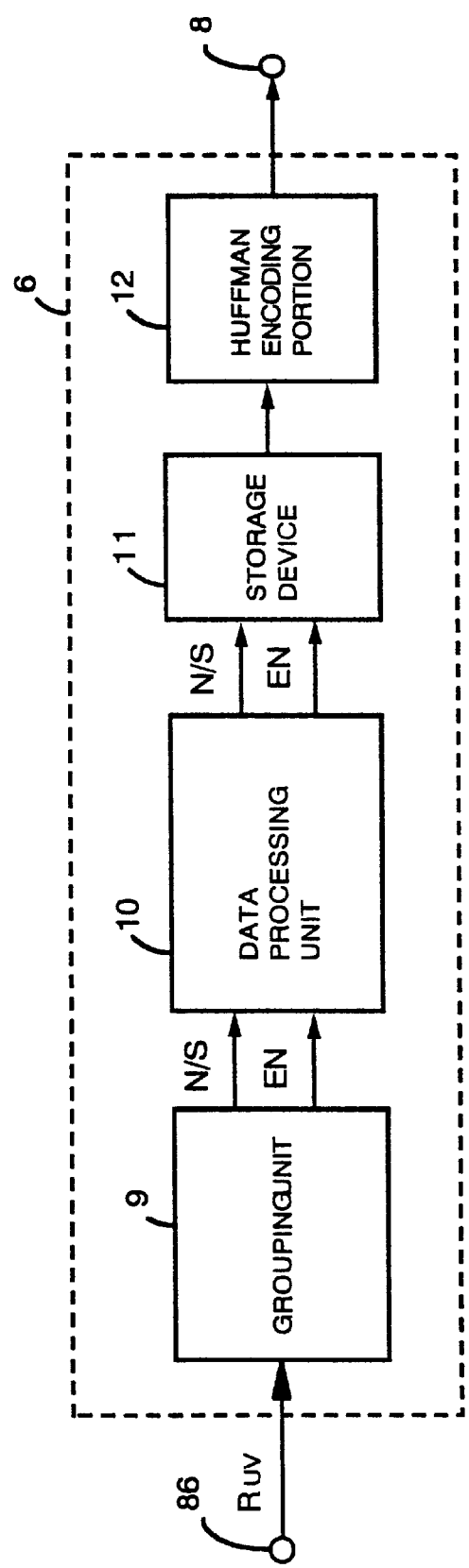
FIG. 2 is a block diagram showing a configuration of a circuit for detecting a ZRL* code, an effective coefficient, and an EOB* code from a grouping portion of an entropy encoding portion according to a first embodiment of the present invention.
Figure 22:
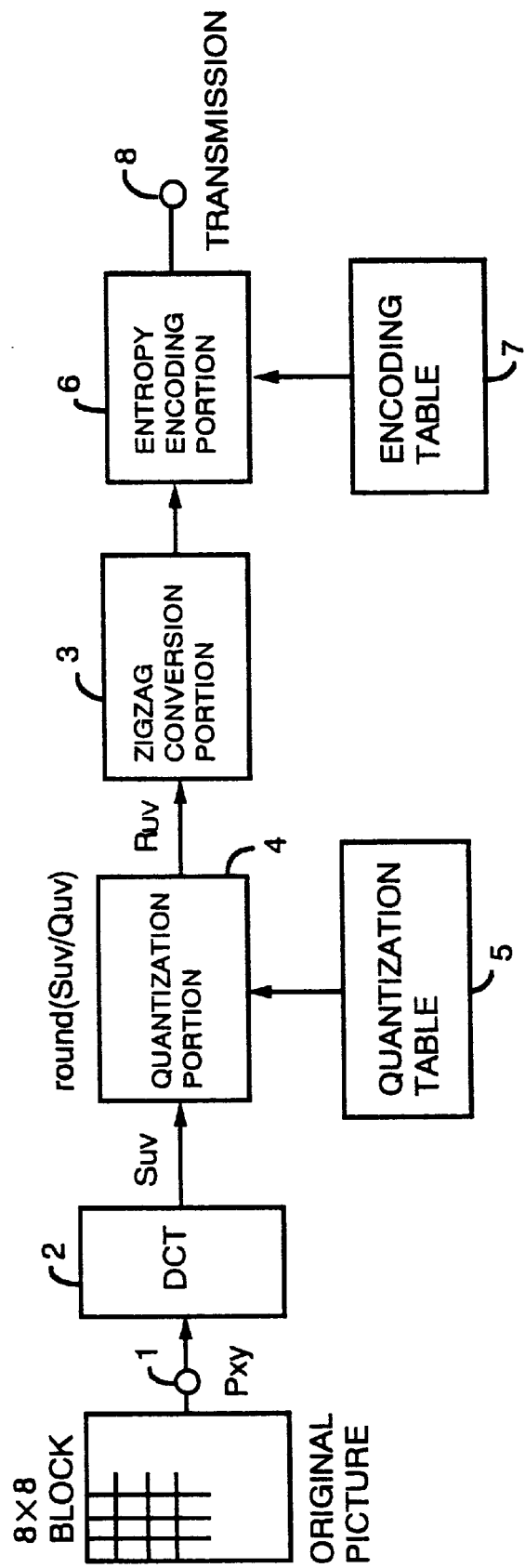
FIG. 22 is a block diagram showing a conventional picture encoding device.
Figure 23:
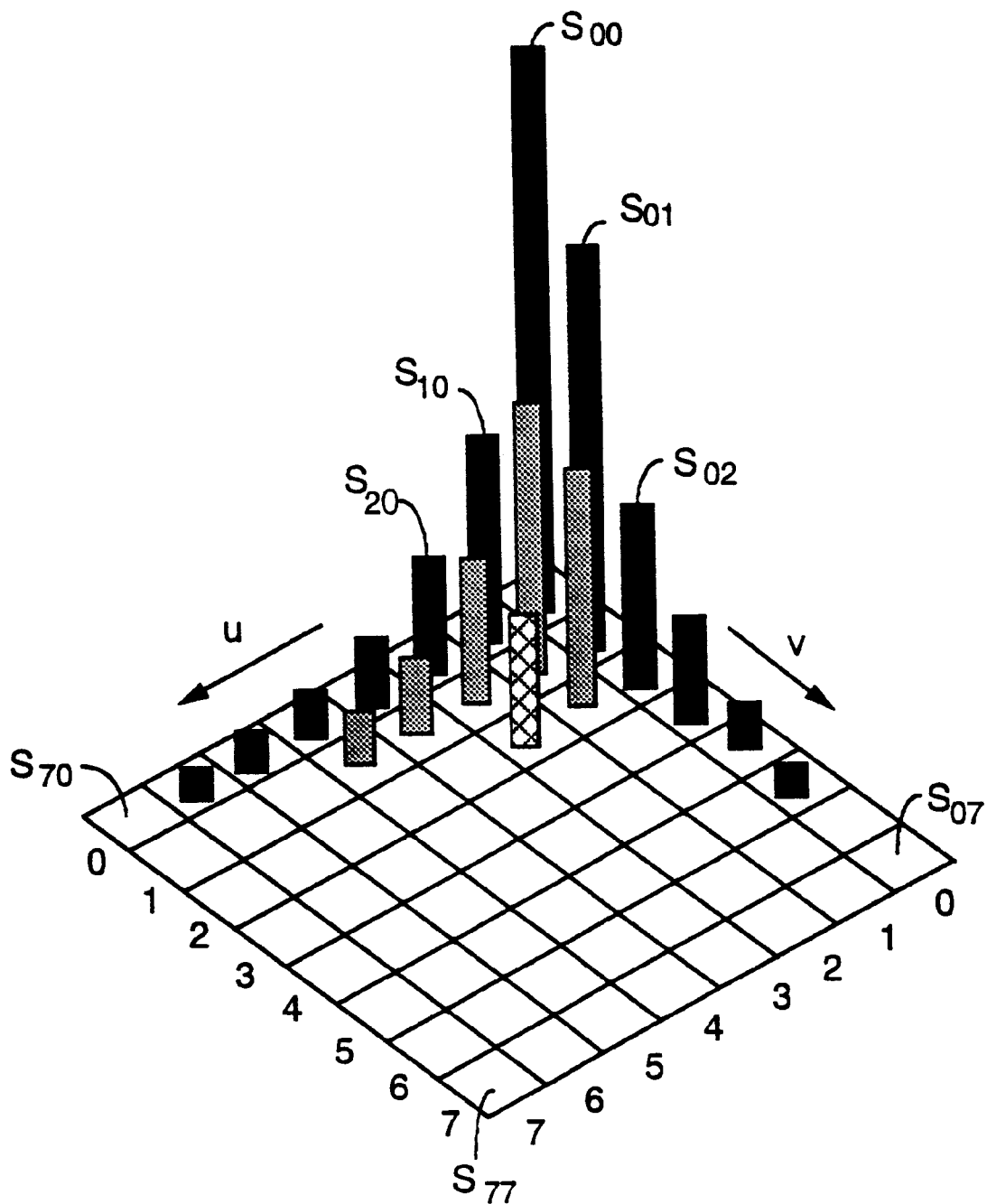
FIG. 23 is a graph showing a distribution of quantized DCT coefficients consisting of 8×8 pixel blocks, after two-dimensional discrete cosine conversion and quantization, in a conventional picture encoding device.
Figure 24:
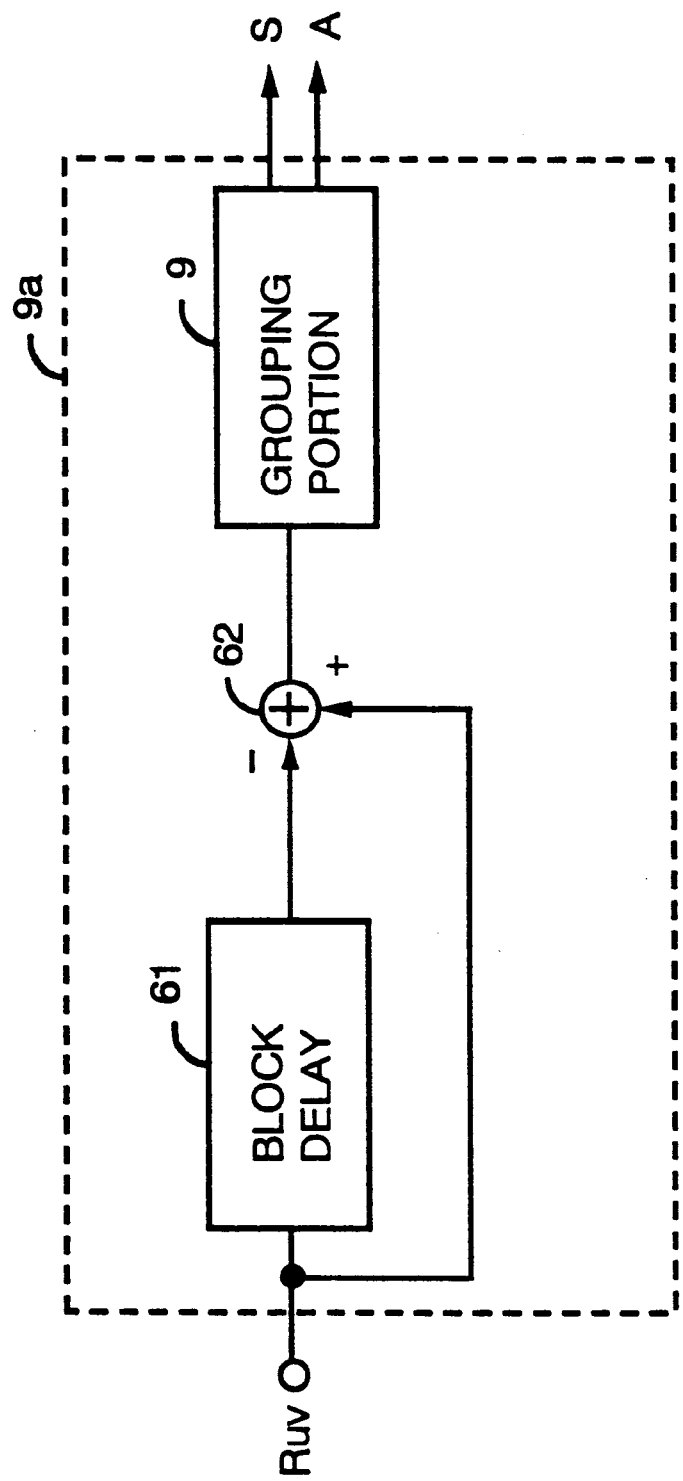
FIG. 24 is a diagram showing a grouping circuit for a DC coefficient in a conventional picture encoding device.
Figure 25:
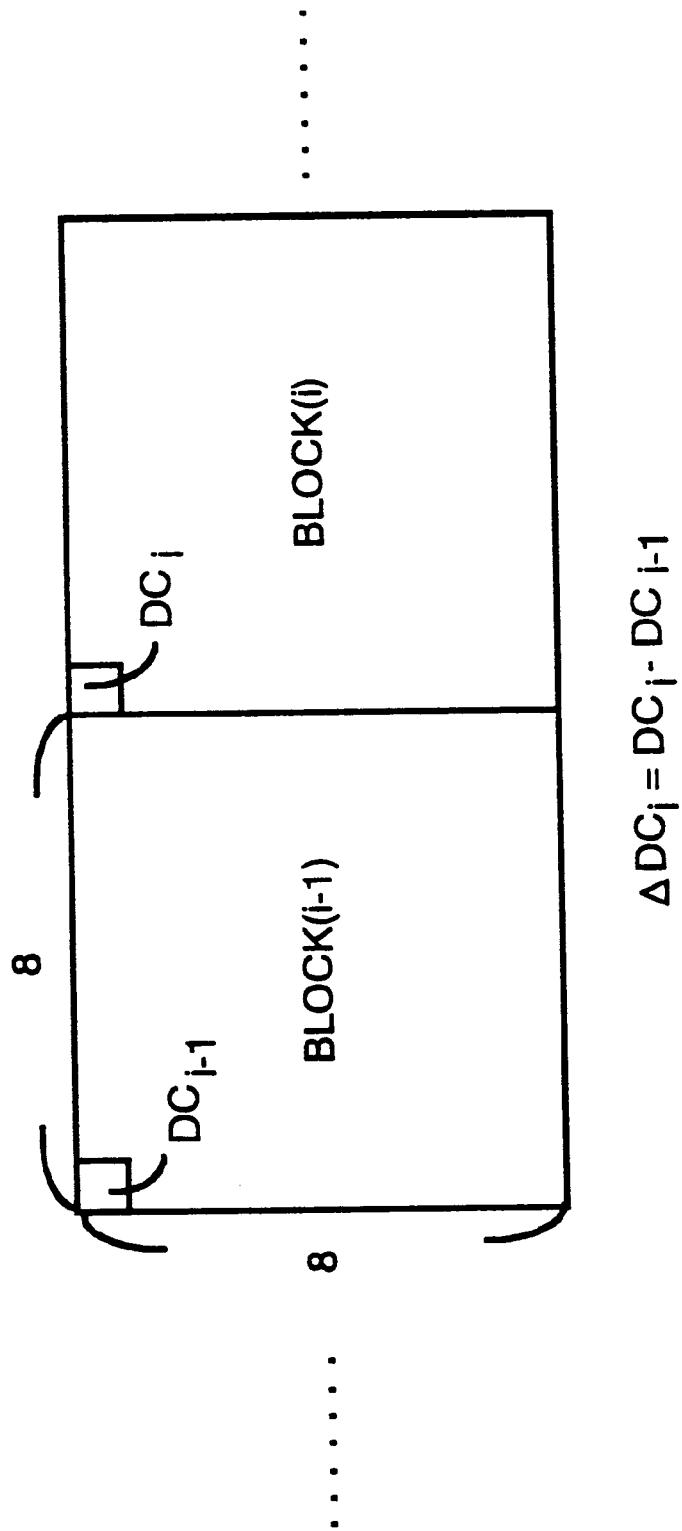
FIG. 25 is a block diagram showing a concept of differential processing of a DC coefficient in a conventional picture encoding device.
Figure 26:
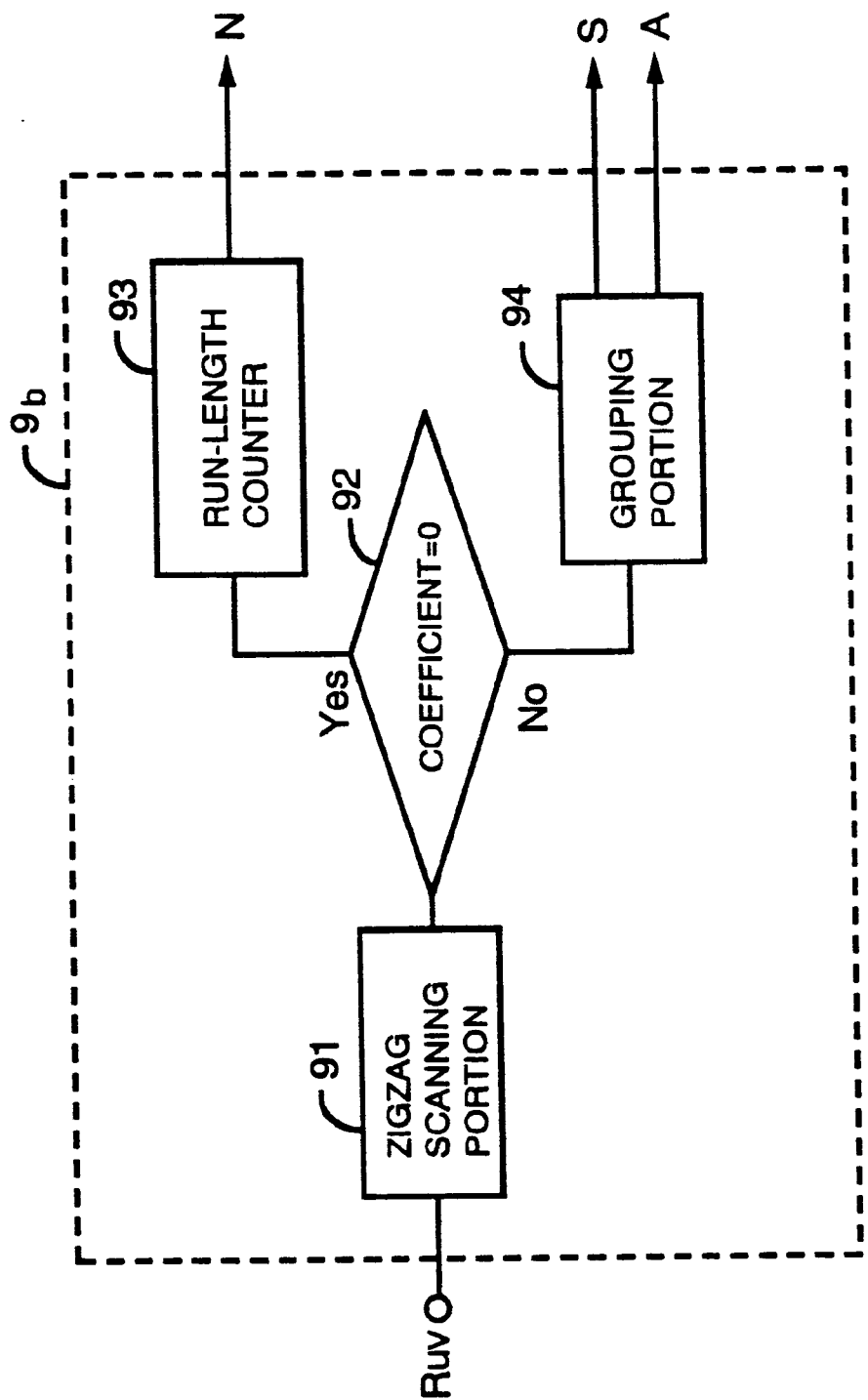
FIG. 26 is a block diagram showing a grouping circuit for an AC coefficient in a conventional picture encoding device.
Figure 27:
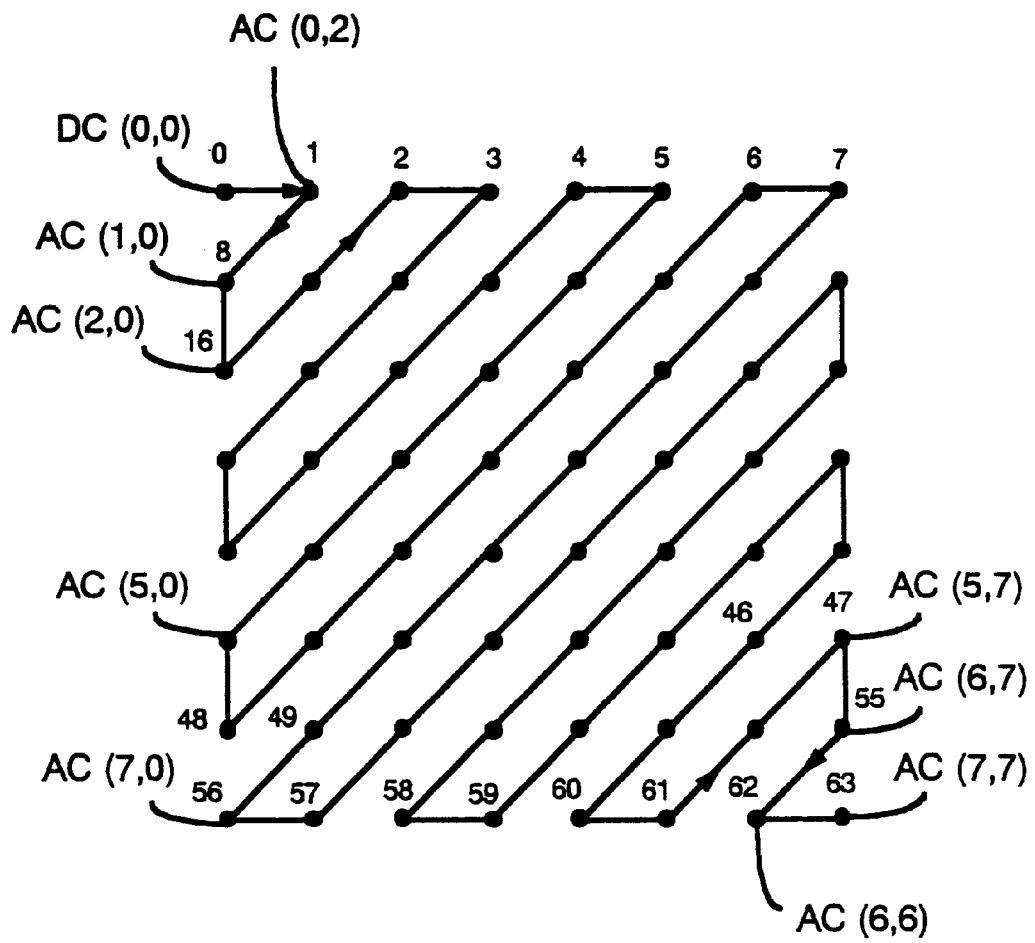
FIG. 27 is a diagram showing the order of zigzag scanning of 8×8 pixel blocks in a conventional picture encoding device.
Figure 28:
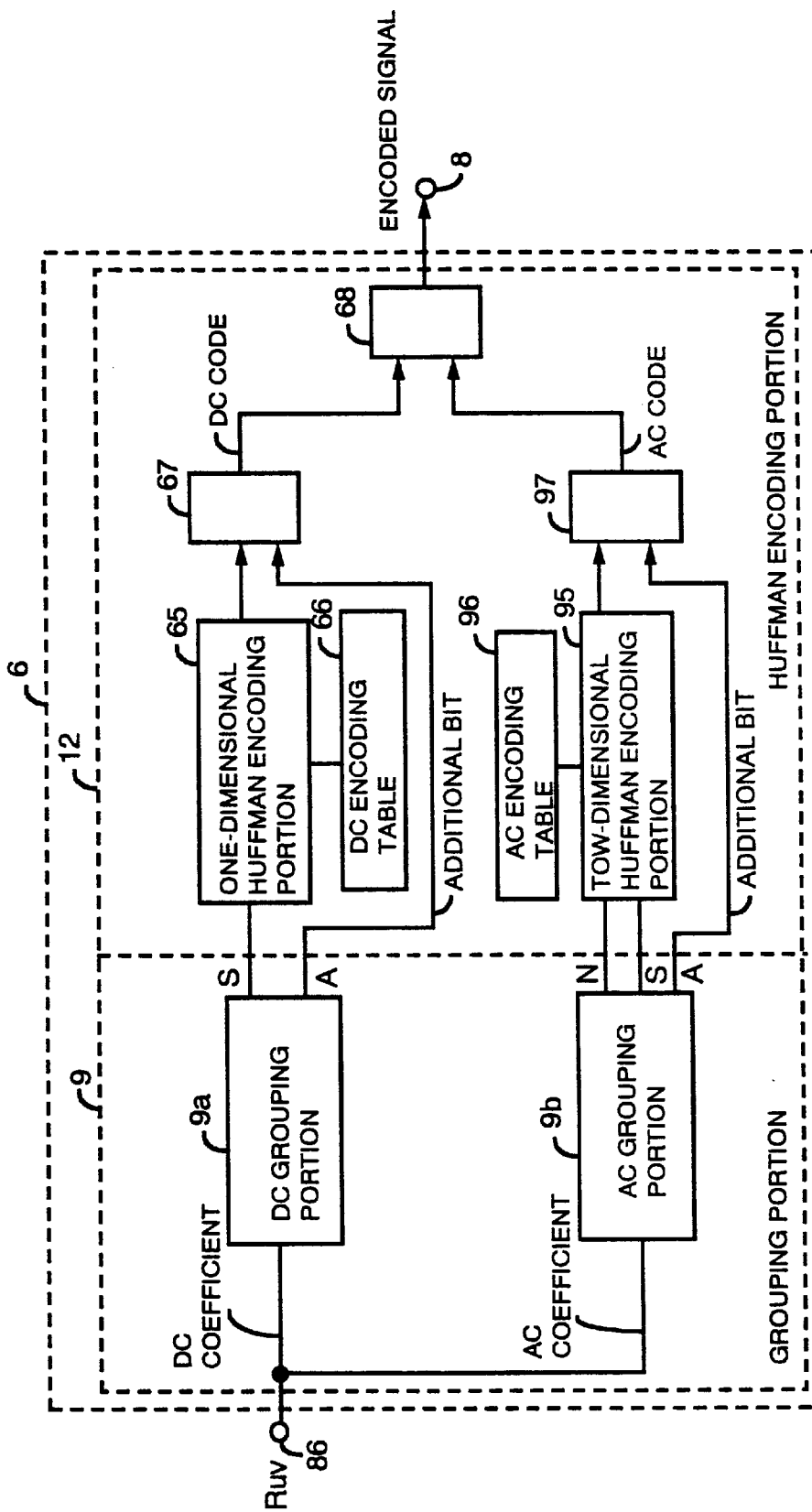
FIG. 28 is a block diagram showing Huffman encoding of a DC coefficient and AC coefficients in a conventional picture encoding device.
Figure 33:
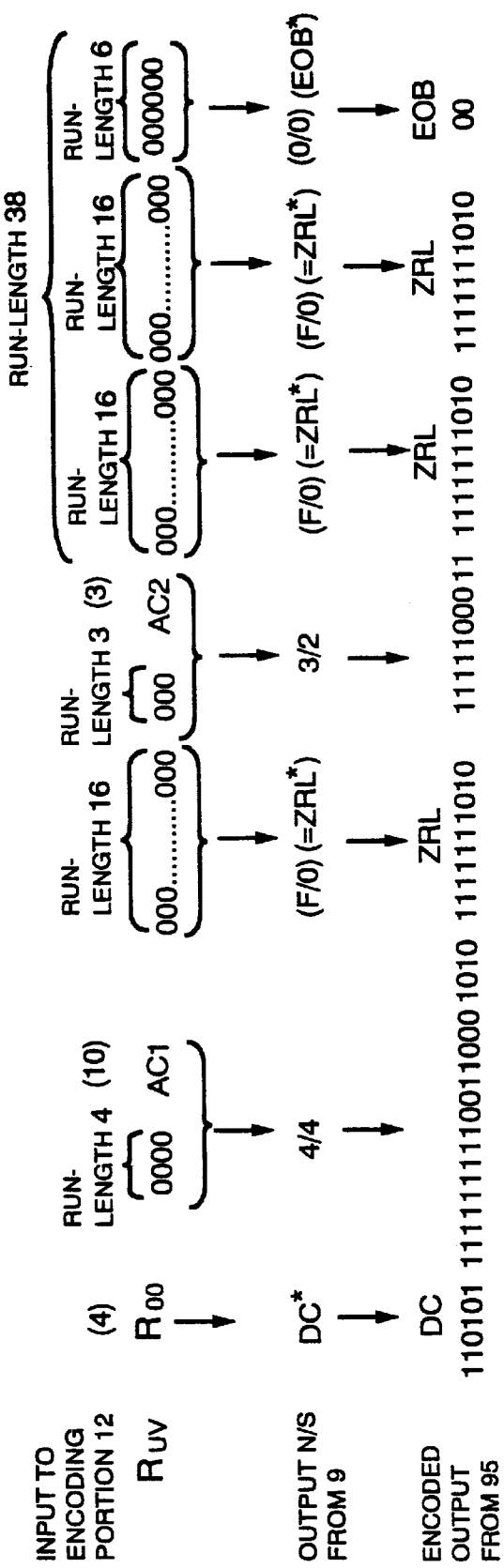
FIG. 33 is a diagram showing the processing order for grouping an AC coefficient and a DC coefficient in a conventional picture encoding device.

FIG. 1 is a diagram showing the general structure of a picture encoding device according to the present invention, comprising an input terminal 1 to which 8×8 pixel data is inputted, a discrete cosine conversion portion (DCT) 2, a zigzag conversion portion 3', a quantization portion 4, a quantization table 5, an entropy encoding portion 6', an encoding table 7, and an output terminal 8 from which parameter and encoding data are outputted. FIG. 2 is a diagram showing a circuit configuration for detecting a ZRL* code, an effective coefficient, and an EOB* code from a grouping portion in the entropy encoding portion according to the first embodiment of the present invention and comprising an entropy encoding portion 6', a grouping unit 9, a data processing unit 10, a storage device 11, and a Huffman encoding portion 12. The Huffman encoding portion 12 is the same as the conventional one explained with reference to FIG. 22.

The operation of the picture encoding device according to the first embodiment is explained with reference to FIG. 1 and FIG. 2. The discrete cosine conversion portion (DCT) 2 carries out a two-dimensional discrete cosine conversion for every picture component consisting of 8×8 pixels and the resultant sixty-four DCT coefficients $S_{UV}$ are inputted into a quantization portion 4. The quantization portion 4 divides these DCT coefficients $S_{UV}$ by $Q_{UV}$ in the quantization table 5. The quantized sixty-four coefficients $R_{UV}$ are transmitted to the zigzag conversion portion 3', where the quantized sixty-four coefficients $R_{UV}$ in serial order are permuted into quantized coefficients in zigzag order. The sixty-four permuted zigzag-order coefficients $R_{UV}$ are inputted into the entropy encoding portion 6' and a grouping unit 9. The zigzag conversion portion 3' outputs the same sixty-four coefficients as those inputted since the zigzag conversion portion 3' only carries out a permutation of sixty-four coefficients without any processing of each coefficient itself. The first data of the zigzag-order sixty-four coefficients $R_{UV}$ is a DC coefficient, and the second to sixty-fourth data are AC coefficients, respectively. In this way, the zigzag-order sixty-four coefficients $R_{UV}$ are inputted into the grouping unit 9 in the entropy encoding portion 6' shown in FIG. 2.

In FIG. 2, the grouping unit 9 in the entropy encoding portion 6' outputs a run-length (N), a group number (S), and an enable signal (EN) according to the value of the inputted sixty-four coefficients $R_{UV}$ which are permuted into zigzag order. The N/S outputted from the grouping unit 9 indicates an output which combines the run-length (N) and a group number (S). The grouping unit 9 outputs one ZRL* code when the value of the data $R_{UV}$ continues with sixteen zeros. Since the ZRL* code is given in relation to sixty-three coefficients, excepting $R_{00}$, no more than three symbols (16×3=48) appear in one block (8×8 pixels).

The data processing unit 10 in FIG. 2 receives a run-length/group number (N/S) and an enable signal (EN), which are outputted from the grouping unit 9, and recognizes an effective coefficient (S) and ZRL* codes. The run-length (N) and the recognized effective coefficient (S) are transmitted to the storage device 11 with an enable signal (EN) as a run-length/group number (N/S). The ZRL* codes recognized in the data processing unit 10 are stored temporarily in the storage device 11 and, if an EOB* code is detected after the ZRL* codes are received, the ZRL* codes are eliminated before they are encoded by the Huffman encoding portion 12. The storage device 11 absorbs the processing speed differences between the data processing unit 10 and the Huffman encoding portion 12. The data group temporarily stored in the storage device 11 is transmitted to the Huffman encoding portion 12 as necessary, where the Huffman encoding processing is carried out.

Embodiment 2

Figure 3:
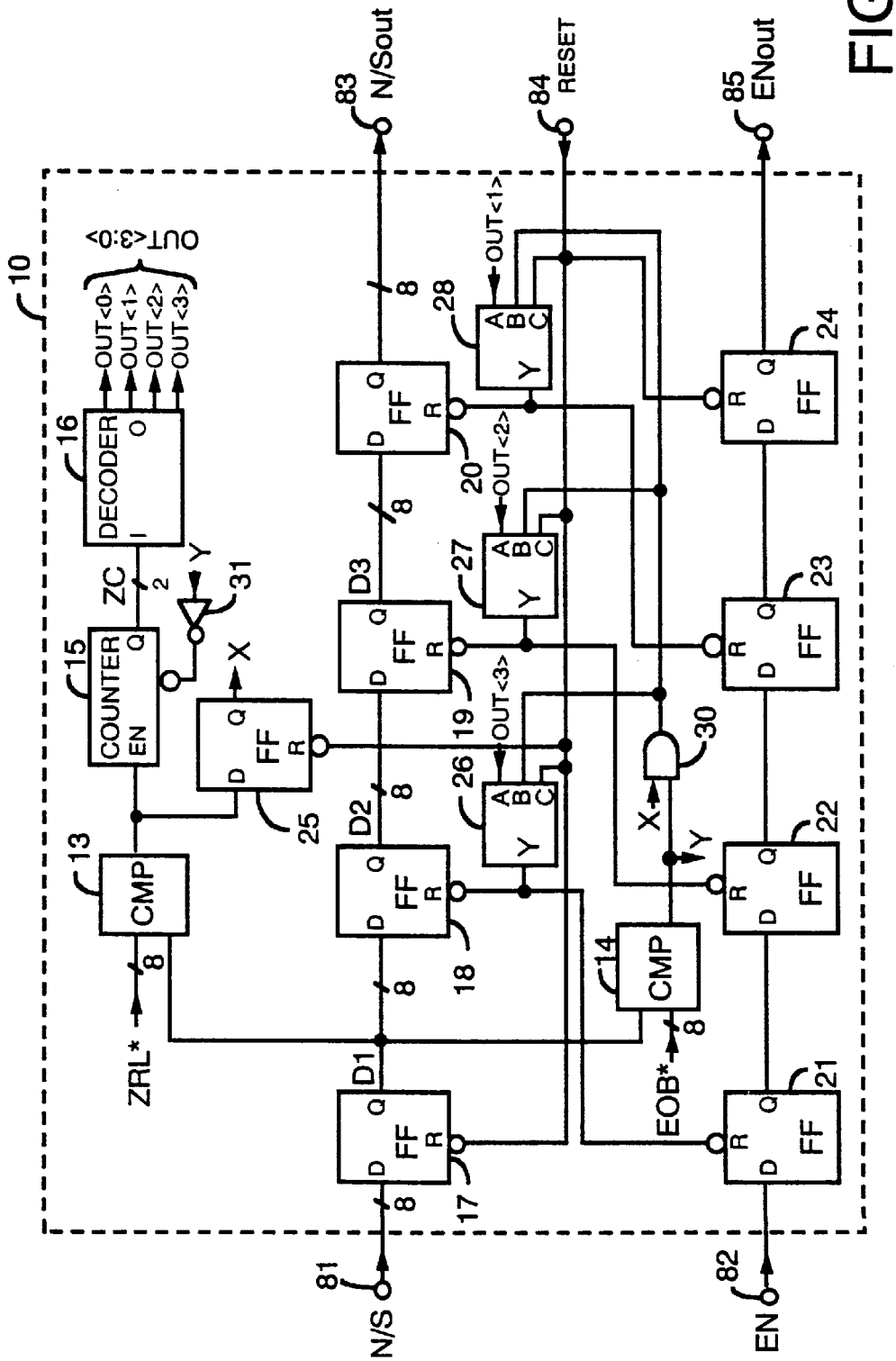
FIG. 3 is a block diagram showing a data processing unit in an entropy encoding portion of a picture encoding device according to a second embodiment of the present invention.

In a second embodiment, the operation of the data processing unit 10 in the entropy encoding portion, shown in the block diagram of embodiment 1, is explained with reference to a specific example. FIG. 3 is a diagram showing a data processing unit in the entropy encoding portion of the picture encoding device according to the second embodiment. The data processing unit 10 comprises a ZRL* code detection circuit 13, an EOB* code detection circuit 14, a ZRL* code count detection counter 15, a decoder 16, data transmission flip-flops 17–20, enable signal transmission flip-flops 21–24, a delay adjustment flip-flop 25, three-input logic circuits 26–28, a two-input AND circuit 30, and an inverter circuit 31. A run-length/group number N/S signal is inputted from an N/S signal input terminal 81 and outputted from an N/S signal output terminal 83. An enable signal (EN) is inputted from an enable signal input terminal 82 and outputted from an enable signal output terminal 85. A RESET signal is inputted from a RESET signal input terminal 84.

Figure 5:
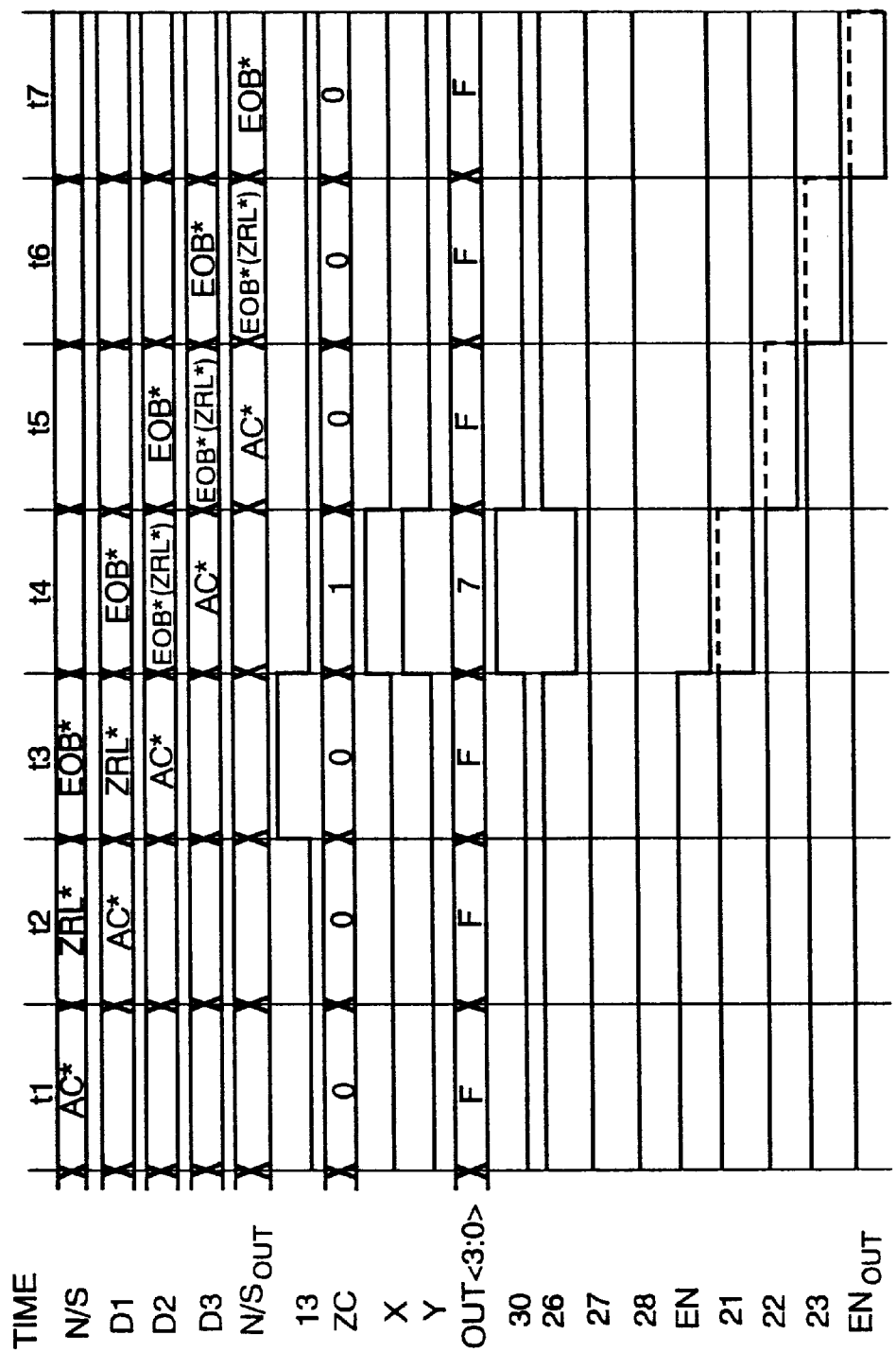
FIG. 5 is a timing chart when an input signal of the diagram of FIG. 3 consists of ZRL*x1, BOB*.
Figure 6:
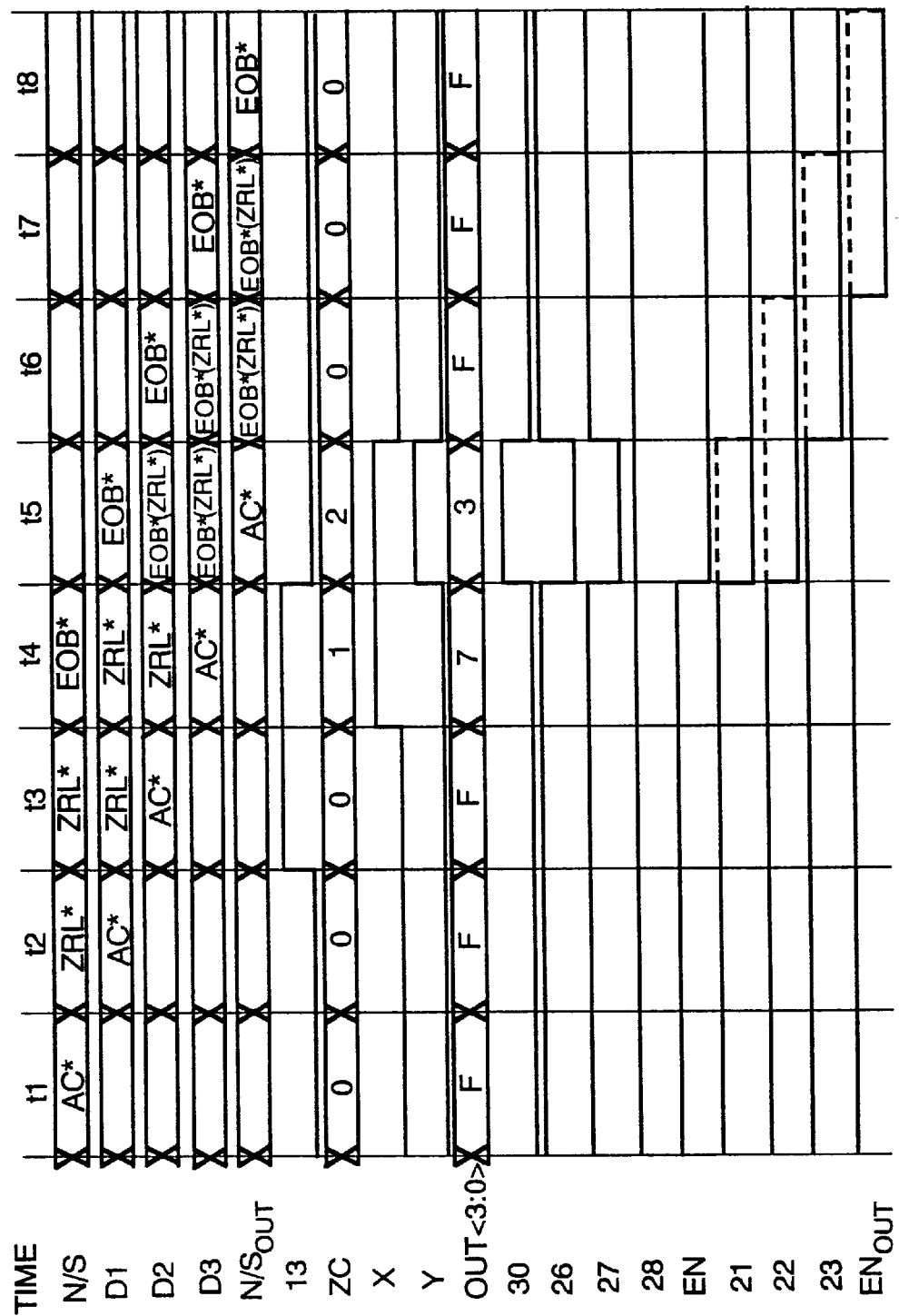
FIG. 6 is a timing chart when an input signal of the diagram of FIG. 3 consists of ZRL*x2, BOB*.
Figure 7:
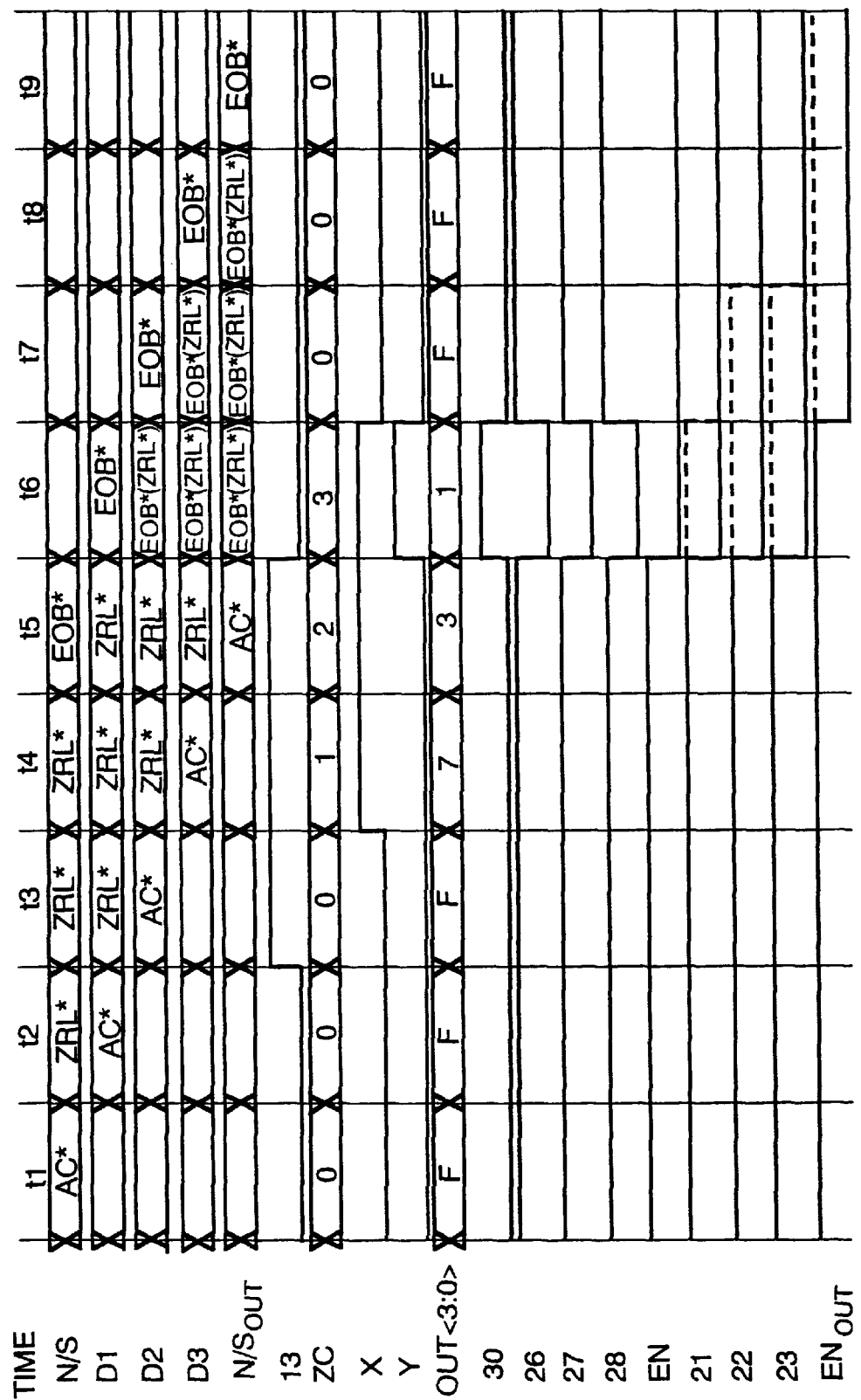
FIG. 7 is a timing chart when an input signal of the diagram of FIG. 3 consists of ZRL*x3, EOB*.

FIG. 4 is a truth table for the three-input logic circuits 26–28. FIG. 5 is a timing chart for a signal inputted into the data processing unit 10 of FIG. 3 according to the order of ZRL*, EOB*. FIG. 6 is a timing chart of a signal inputted to the data processing unit 10 in FIG. 3 according to the order of ZRL*, ZRL*, EOB*. A last EOB* code is inputted immediately after two ZRL*s are continuously inputted. FIG. 7 is a timing chart for a signal inputted into the data processing unit 10 in FIG. 3 according to the order of ZRL*, ZRL*, ZRL*, and EOB*, namely, a last EOB* code is inputted immediately after three ZRL*s are continuously inputted.

The operation of the data processing unit 10 in FIG. 3 is explained with reference to FIG. 5 when an N/S signal having the order of ( . . . AC coefficient (AC*), ZRL*, EOB* . . . ) is inputted into a D terminal of the flip-flop 17. The N/S signal inputted into the flip-flop 17 is an eight bit parallel signal. In FIG. 5, the signal having the order of AC coefficient (AC*), ZRL*, EOB*_, which is inputted into the input terminal 81, is shifted by the respective flip-flops 17–20 according to a clock signal, not illustrated in FIG. 5, as shown by N/S in FIG. 5, The respective waveforms on the Q terminals D1, D2, and D3 of the respective flip-flops 17, 18, and 19 are shifted as shown by the signals D1, D2, and D3 in FIG. 5. After being shifted by the flip-flop 20, the signal is outputted as an $N/S_{OUT}$ signal from the output terminal 83 to the storage device 11 in the next stage. Concurrently, an enable signal (EN), inputted to the input terminal 82, is shifted by the respective flip-flops 21–24 according to the clock signal, not illustrated, as shown by EN in FIG. 5, and outputted from the output terminal 85 to the storage device 11 in the next stage as the $EN_{OUT}$ signal.

The ZRL* code detection circuit 13 compares a ZRL signal inputted into one terminal as an N/S signal and a ZRL* signal, a reference signal (for example, 11110000 in binary), inputted at the other terminal. The ZRL* code detection circuit 13 awaits a ZRL* inputted from the Q output terminal D1 of the flip-flop 17 at a time t3. When the ZRL* is inputted into the input terminal 81 at the time t2, the ZRL* signal appears on the Q output terminal D1 of the flip-flop 17 in the next clock (at a time t3). Therefore, at the time t3, a logical "H" appears on the output terminal of the ZRL* code detection circuit 13, and this logical "H" appears on the Q output terminal of the flip-flop 25 as an X signal in the next clock (at a time t4).

The ZRL* code count detection counter 15 counts outputs from the ZRL* code detection circuit 13, and outputs four different kinds of signals as a two bit output. The output signal ZC from the ZRL* code count detection counter 15 is decoded in the decoder 16, and then outputted as OUT<0>to OUT<3>. The relationship between the output ZC from the ZRL* code count detection counter 15 and the output OUT<3:0>from the decoder 16, i.e., the values of OUT<O>, OUT<1>, OUT<2>, and OUT<3>, represented in hexadecimal, are shown below. If ZC=0, then OUT<3:0>=F, i.e., OUT<0>=1, OUT<1>=1, OUT<2>=1, and OUT<3>1. If ZC=1, then OUT<3:0>=7, i.e., OUT<0>=1, OUT<1>=1, OUT<2>=1, and OUT<3>=0. If ZC=2, then OUT<3:0>=3, i.e., OUT<0>=1, OUT<1>=1, OUT<2>=0, and OUT<3>=0. If ZC=3, then OUT<3:0>=1, i.e., OUT<0>=1, OUT<1>=0, OUT<2>=0, and OUT<3>=0.

The EOB* code detection circuit 14 compares an EOB* signal inputted as an N/S signal and an EOB* signal, a reference signal. In this example, a signal having a reference EOB* value (for example, 00000000 in binary) is inputted to one terminal of the EOB* code detection circuit 14. The EOB* code detection circuit 14 awaits an EOB* which will be inputted from the Q output terminal of the flip-flop 17. When the EOB* is inputted into the input terminal 81 at a time t3, the EOB* signal appears on the Q output terminal D1 of the flip-flop 17 in the next clock (at a time t4). Therefore, at the time t4, a logical "H" appears on the output terminal of the EOB* code detection circuit 14 as a Y signal.

The output X from the flip-flop 25 and the output Y from the EOB* code detection circuit 14 are inputted to the two-input AND circuit 30. When both X and Y become logical "H", logical "HH" is outputted from the two-input AND circuit 30 (refer to "30" in FIG. 5).

When the output from the two-input AND circuit 30 becomes logical "H", since the output OUT <3:0>from the decoder 16 is 7, i.e., OUT<3>=0, and the RESET signal, which is inputted into the input terminal 84, is logical "H", other than its rise time, and the output from the three-input logic circuit 26 becomes logical "L", according to FIG. 4. Accordingly, logical "L" is applied to an R (reset) terminal of the flip-flop 18, and the content in the flip-flop 18 is cleared. In other words, as shown by D2 in FIG. 5, when the output from the two-input AND circuit 30 is logical "H", the ZRL* is replaced by the EOB* (=00000000). The N/S signal, in which the ZRL* is replaced by the EOB* in this way, is shifted by the respective flip-flops 19 and 20, and outputted from the output terminal 83 as N/S$_{OUT}$.

On the other hand, logical "L" in the three-input logic circuit 26 is applied to the R (reset) terminal of the enable signal transmission flip-flop 21 at the time t4, and the content in the flip-flop 21 is cleared. This is shown by the replacement of the dotted line portion "21" in FIG. 5 with the solid line. In this way, concurrently with the replacement of the ZRL* with the EOB*, the enable signal is also cleared, then shifted by the respective flip-flops 22–24, and outputted from the output terminal 85 as EN$_{OUT}$.

In the present invention, by resetting the data transmission flip-flop 18 and the enable signal transmission flip-flop 21, using the signal from the decoder 16, according the count value ZC from the ZRL* code count detection counter 15, unnecessary ZRL* codes preceding the EOB* are deleted. The ZRL* code count detection counter 15 is reset by the output from the EOB* code detection circuit 14.

The operation of the data processing unit 10 in FIG. 3 is explained with reference to FIG. 6, when an N/S signal having the order of ( . . . AC coefficient (AC*), ZRL*, ZRL*, EOB* . . . ) is inputted to the input terminal 81. In FIG. 6, the signal having the order of AC coefficients (AC*), ZRL*, ZRL*, EOB*__, inputted to the input terminal 81, is shifted by the flip-flops 17–20 according to a clock signal, not illustrated in FIG. 6, as shown by N/S in FIG. 6. The respective waveforms on the Q terminals D1, D2, and D3 of the flip-flops 17, 18, and 19 are shown by the signals D1, D2, and D3 in FIG. 6. After it is shifted by the flip-flop 20, the signal is outputted as an N/S$_{OUT}$ signal from the output terminal 83 to the storage device 11 in the next stage. Concurrently, an enable signal (EN), inputted into the input terminal 82, is shifted by the enable signal transmission flip-flops 21–24 according to the clock signal, not illustrated, as shown by EN in FIG. 6, and then outputted from the output terminal 85 to the storage device 11 in the next stage as EN$_{OUT}$.

The ZRL* inputted into the input terminal 81 at the time t2 appears on the Q output terminal D1 of the flip-flop 17 in the next clock at the time t3. At the time t3, logical "H" appears on the output terminal of the ZRL* code detection circuit 13, and this logical "H" appears on the Q output terminal of the flip-flop 25 as an X signal in the next clock (at a time t4). In this case, since two ZRL*s are continuously inputted from the input terminal 81, the signal X becomes logical "H" during two continuous clocks, i.e., at the time t4 and the time t5.

The ZRL* code count detection counter 15 counts the output from the ZRL* code detection circuit 13. In this case, since the signal X becomes logical "H" during two continuous clocks, the output ZC from the ZRL* code count detection counter 15 becomes "2" at the time t5. The output signal "2" from the ZRL* code count detection counter 15 is decoded at the decoder 16, and outputted as OUT<3:0>=3, i.e., OUT<0>=1, OUT<1>=1, OUT<2>=0, and OUT<3>=0.

In this example, when the EOB* is inputted into the input terminal 81 at a time t4, the EOB* signal appears on the Q output terminal D1 of the flip-flop 17 in the next clock (at a time t5). Therefore, at the time t5, a logical "H" appears on the output terminal of the EOB* code detection circuit 14 as a Y signal.

Since both X and Y become logical "H" at the time t5, the two-input AND circuit 30 outputs logical "H" at the time t5 (refer "30" in FIG. 6). When the output from the two-input AND circuit 30 becomes logical "H", since the output OUT<3:0>from the decoder 16 is three, i.e., OUT<3>=0 and OUT<2>=0, and the RESET signal, which is inputted into the input terminal 84, is logical "H", other than its rise time, the outputs from the three-input logic circuits 26 and 27 become logical "L", according to FIG. 4. Accordingly, logical "L" is applied to each R (reset) terminal of the flip-flops 18 and 19 and the contents in the flip-flops 18 and 19 are cleared. In other words, as shown by D2 and D3 in FIG. 6, when the output from the two-input AND circuit 30 is logical "H", the ZRL* is replaced by the EOB* (=00000000). The N/S signal, in which the two ZRL*s are replaced by the EOB* at the same time in this way, is shifted by the flip-flops 19 and 20, and outputted from the output terminal 83 as an N/S$_{OUT}$.

The logical "L" in each of the three-input logic circuits 26 and 27 is applied to each R (reset) terminal of the enable signal transmission flip-flops 21 and 22 at the time t5, and the flip-flops 21 and 22 are cleared. This is shown by the replacement of each dotted line portion 21 and 22 in FIG. 6 with a respective solid line. In this way, concurrently with the replacement of the two ZRL*s with the EOB*, the two enable signals are also cleared, then shifted by the flip-flops 23 and 24, and outputted from the output terminal 85 as an EN$_{OUT}$.

In the present invention, by resetting the data transmission flip-flops 18 and 19 and the enable signal transmission flip-flops 21 and 22, using the signal from the decoder 16, according the count value ZC (2) from the ZRL* code count detection counter 15, two unnecessary ZRL* codes preceding an EOB* are deleted. The ZRL* code count detection counter 15 is reset by the output from the EOB* code detection circuit 14.

The operation of the data processing unit 10 in FIG. 3 is explained with reference to FIG. 7, when an N/S signal having the order of ( ...AC coefficient (AC*), ZRL*, ZRL*, ZRL*, EOB* ... ) is inputted into the input terminal 81. In FIG. 7, the signal having the order of AC coefficient (AC*), ZRL*, ZRL*, ZRL*, EOB*_, inputted into the input terminal 81, is shifted by the flip-flops 17–20 according to a clock signal, not illustrated in FIG. 7, as shown by N/S in FIG. 7. The respective waveforms on the Q terminals D1, D2, and D3 of the flip-flops 17, 18, and 19 are shown by D1, D2, and D3 in FIG. 7. After the signal is shifted by the flip-flop 20, the signal is outputted as an N/S$_{OUT}$ signal from the output terminal 83 to the storage device 11 in the next stage. Concurrently, an enable signal (EN), inputted into the input terminal 82, is shifted by the enable signal transmission flip-flops 21–24 according to the clock signal, not illustrated, as shown by EN in FIG. 7, and then outputted from the output terminal 85 to the storage device 11 in the next stage as an EN$_{OUT}$ signal.

The ZRL* inputted into the input terminal 81 at the time t2 appears on the Q output terminal D1 of the flip-flop 17 in the next clock at the time t3. At the time t3, logical "H" appears on the output terminal of the ZRL* code detection circuit 13, and this logical "H" appears on the Q output terminal of the flip-flop 25 as an X signal in the next clock (at a time t4). In this case, since three ZRL*s are continuously inputted from the input terminal 81, the signal X becomes logical "H" during three continuous clocks, i.e., at the times t4, t5, and t6.

The ZRL* code count detection counter 15 counts the output from the ZRL* code detection circuit 13. In this case, since the signal X becomes logical "H" during three continuous clocks, the output ZC from the ZRL* code count detection counter 15 becomes "3" at the time t6. The output signal "3" from the ZRL* code count detection counter 15 is decoded at the decoder 16, and outputted as OUT<3:0>=1, i.e., OUT<0>=1, OUT<1>=0, OUT<2>=0, and OUT<3>=0.

On the other hand, in this example, when the EOB* is inputted into the input terminal 81 at a time t6, the EOB* signal appears on the Q output terminal D1 of the flip-flop 17 in the next clock (at a time t5). Therefore, at the time t6, a logical "H" appears on the output terminal of the EOB* code detection circuit 14 as a Y signal.

Since both X and Y become logical "H" at the time t6, the two-input AND circuit 30 outputs logical "H" at the time t6 (refer "30" in FIG. 7). When the output from the two-input AND circuit 30 becomes logical "H", since the output OUT<3:0> from the decoder 16 is 1, i.e., OUT<3>=0, OUT<2>=0, OUT<1>=0, and the RESET signal, inputted into the input terminal 84, is logical "H", other than its rise time, the outputs from the three-input logic circuits 26, 27, and 28 become logical "L", according to FIG. 4. Accordingly, logical "L" is applied to each R (reset) terminal of the flip-flops 18, 19, and 20 and the contents in the respective flop-flops 18, 19, and 20 are cleared. In other words, as shown by D2, D3, and N/S$_{OUT}$ in FIG. 7, when the output from the two-input AND circuit 30 is logical "H", the ZRL* is replaced by the EOB* (=00000000). The N/S signal, in which the three ZRL*s are replaced by the EOB* at the same time in this way, is shifted by the flip-flops 19 and 20, and outputted from the output terminal 83 as N/S$_{OUT}$.

On the other hand, logical "L" in each of the three-input logic circuits 26, 27, and 28 is applied to each R (reset) terminal of the enable signal transmission flip-flops 21, 22, and 23 and at the time t6 the contents in the flip-flops 21, 22, and 23 are cleared. This is shown by the replacement of each dotted line portion "21", "22", and "23" in FIG. 7 with the respective solid lines. In this way, concurrently with the replacement of the two ZRLs with the EOB*, the three enable signals are also cleared, shifted by the flip-flops 23 and 24, and outputted from the output terminal 85 as EN$_{OUT}$.

In this example of the present invention, by resetting the data transmission flip-flops 18, 19, and 20 and the enable signal transmission flip-flops 21, 22, and 23 using the signal from the decoder 16, according the count value ZC (3) from the ZRL* code count detection counter 15, three unnecessary ZRL* codes preceding an EOB* are deleted. The ZRL* code count detection counter 15 is reset by the output from the EOB* code detection circuit 14.

Embodiment 3

Figure 8:
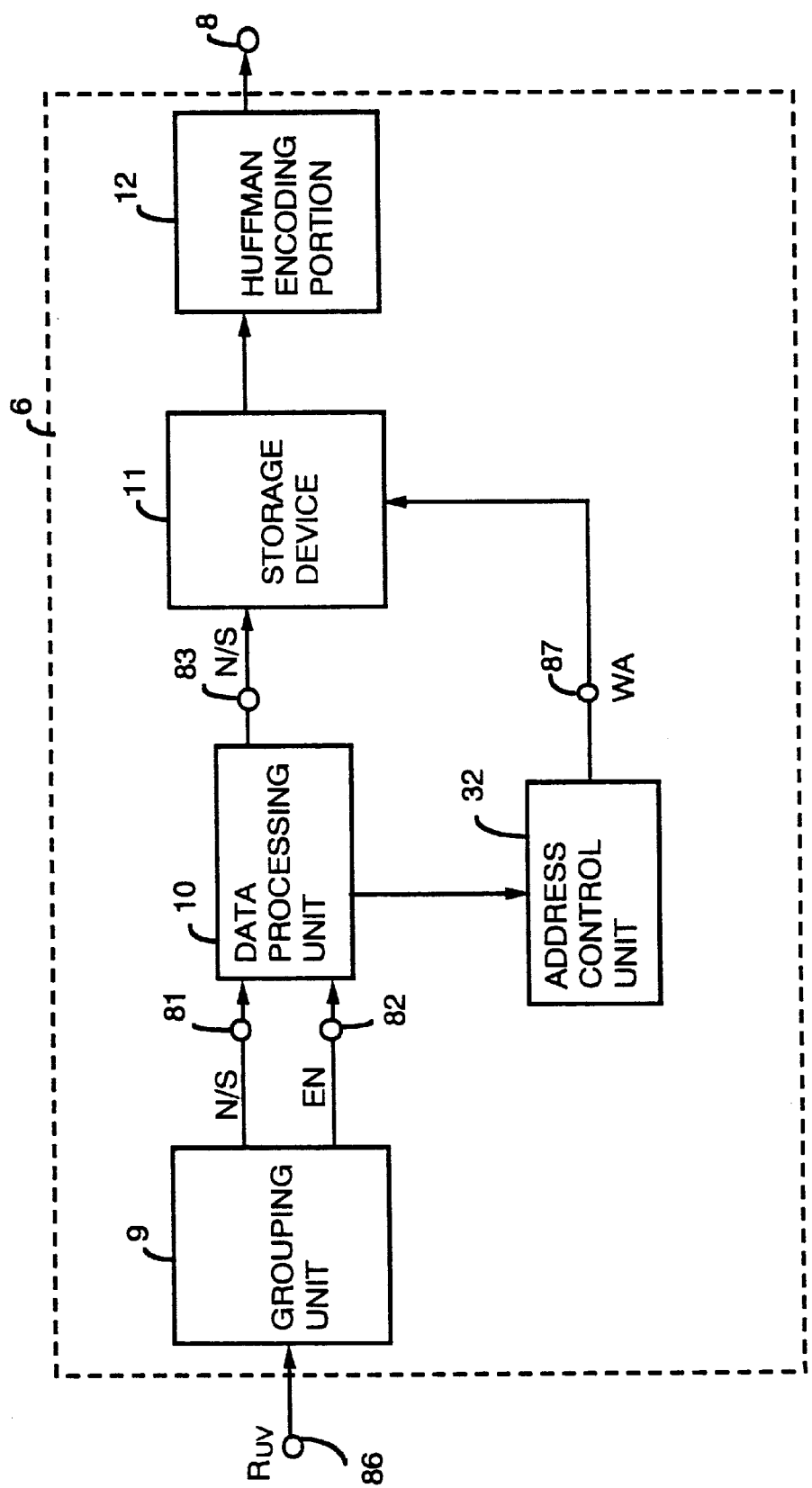
FIG. 8 is a block diagram showing the configuration of a data processing unit and an address control unit having a symbol processing function, respectively, in an entropy encoding portion in a picture encoding device according to a third embodiment of the present invention.
Figure 9:
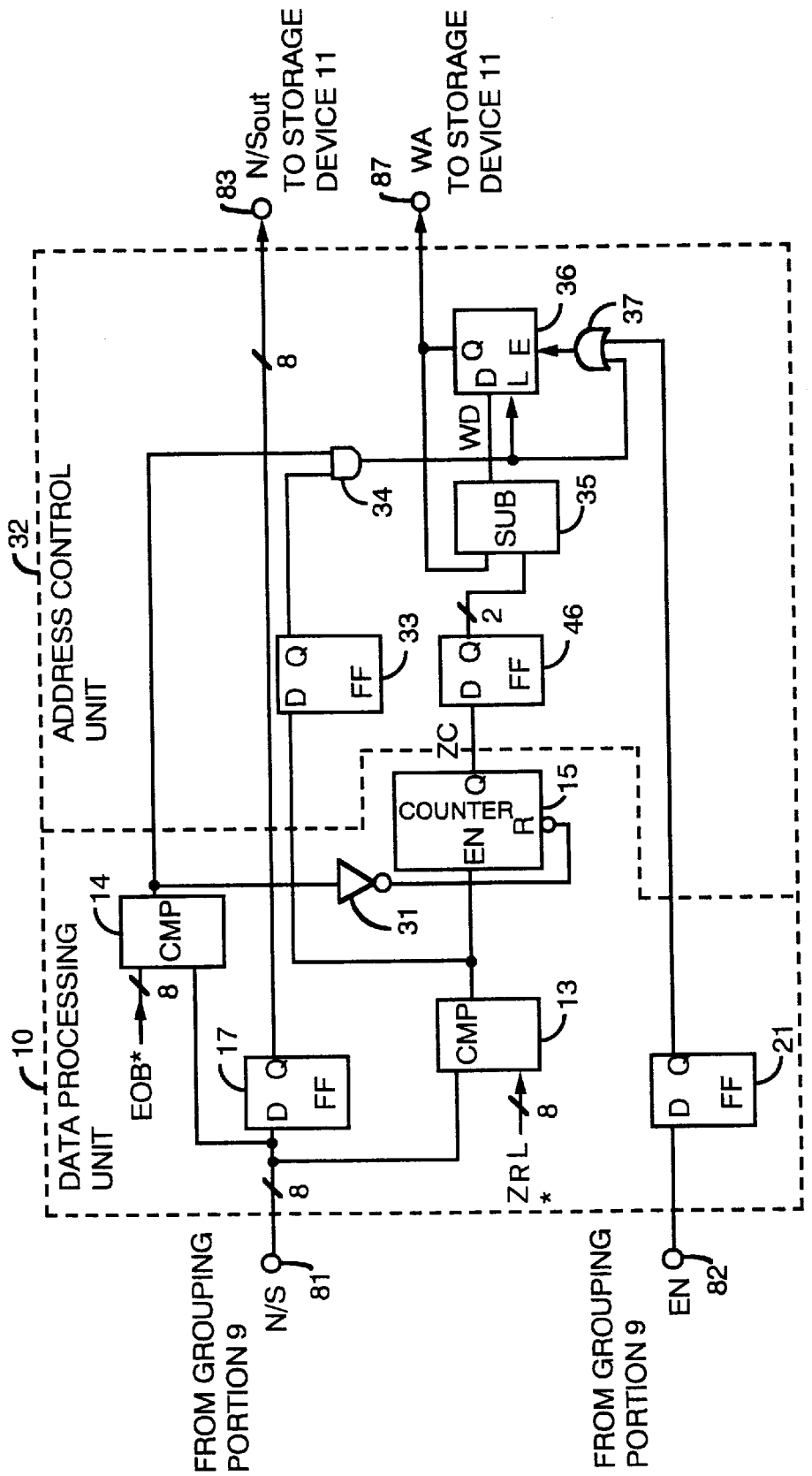
FIG. 9 is a block diagram showing a data processing unit in an entropy encoding portion of a picture encoding device according to the third embodiment of the present invention.

FIG. 8 and FIG. 9 are diagrams showing a third embodiment of the present invention. In the third embodiment, an address control unit for controlling an address generation portion of the storage device 11 may be added to the data processing unit comprising the data transmission flip-flops 17–20 and the enable signal transmission flip-flops 21–24 of the second embodiment.

Figure 10:
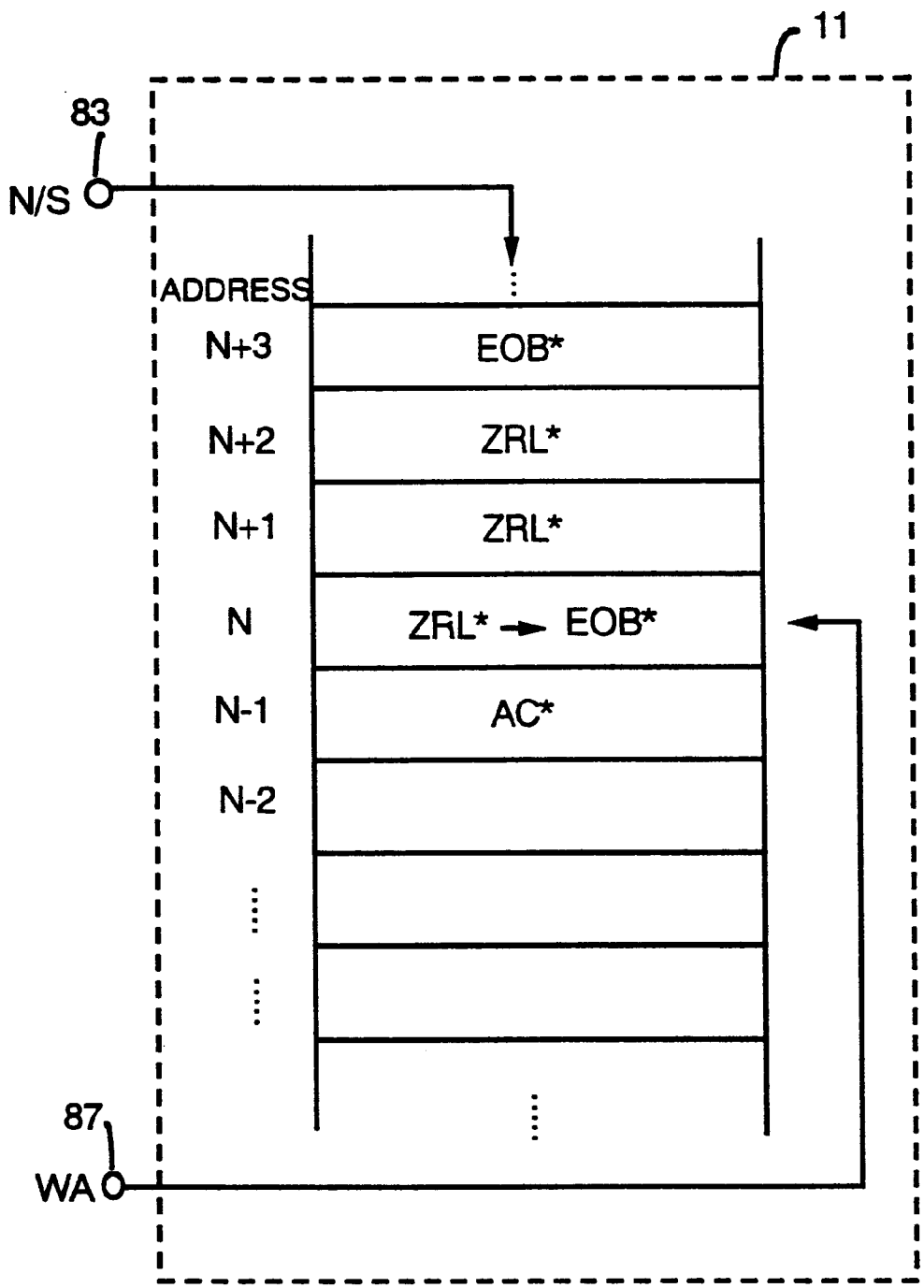
FIG. 10 is a block diagram showing a storage device according to the third embodiment of the invention.
Figure 11:
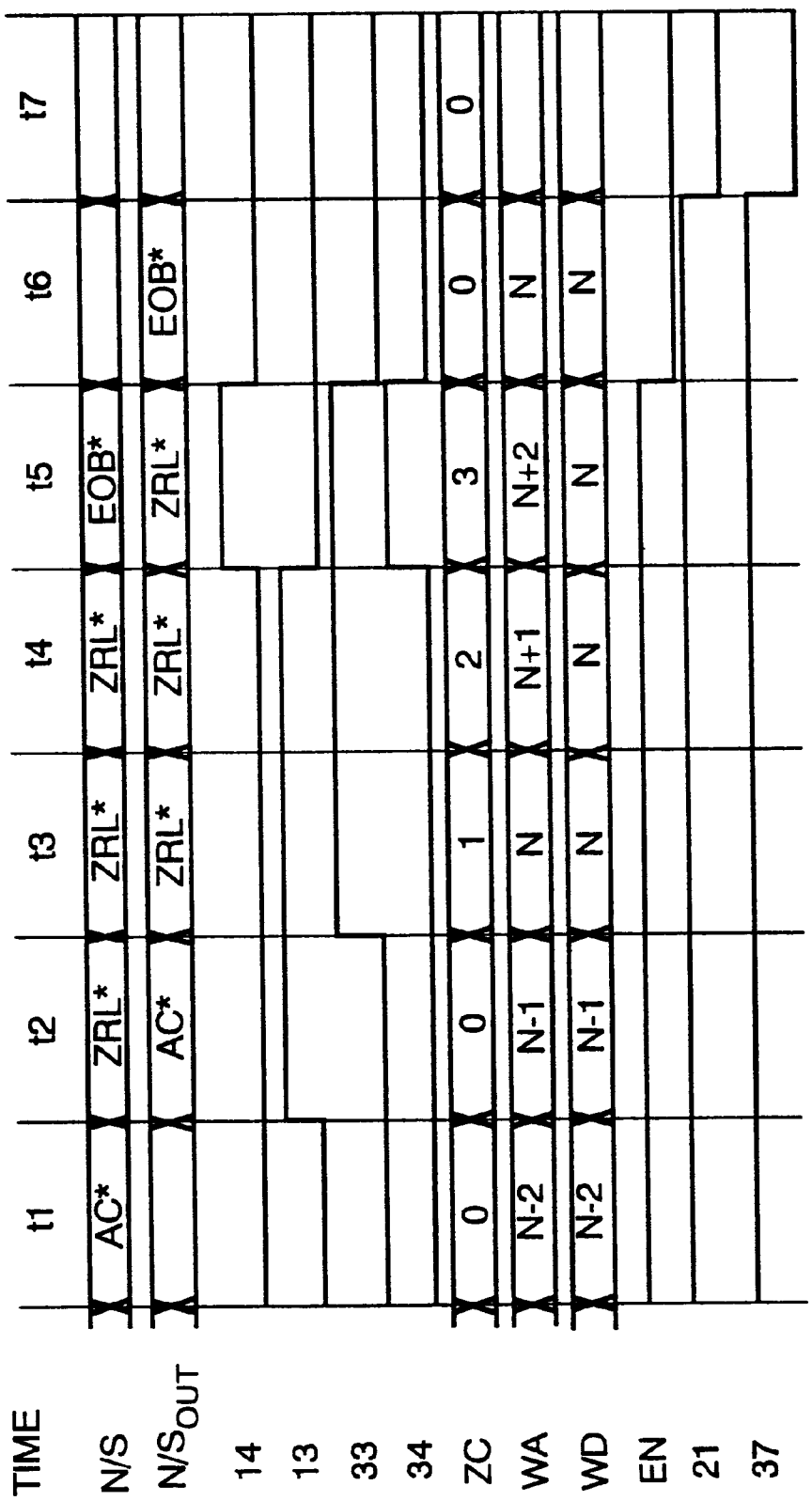
FIG. 11 is a timing chart showing operation of a circuit according to the third embodiment of the present invention.

FIG. 8 shows an entropy encoding portion comprising a grouping unit 9, a data processing unit 10, a storage device 11, and an address control unit 32. An R$_{UV}$ signal is inputted from an input terminal 86, and an encoded signal is outputted from an output terminal 8. FIG. 9 is a circuit diagram showing the data processing unit 10 and the address control unit 32 shown in FIG. 8. The data processing unit 10 comprises a ZRL* code detection circuit 13, an EOB* code detection circuit 14, a ZRL* code count detection counter 15, a data transmission flip-flop 17, an enable signal transmission flip-flop 21, an inverter circuit 31, delay adjustment flip-flops 33 and 46, a two-input AND circuit 34, a subtractor 35, a counter 36 with an address setting load (hereinafter, simply referred to as an address counter), and a two-input OR circuit 37. An N/S signal is inputted from an input terminal 81, and outputted from an output terminal 83. An enable signal (EN) is inputted from an input terminal 82. A write-in address signal (WA) is outputted from an output terminal 87, FIG. 10 is a diagram showing a detailed circuit configuration of the storage device 11, where an N/S signal is inputted from an input terminal 83, and a write-in address signal (WA) is inputted from an input terminal 87. FIG. 11 is a timing chart of a signal at each portion according to the third embodiment of the present invention.

The operations of the respective circuits shown in FIG. 8 and in FIG. 9 are explained with reference to FIG. 8, FIG. 9, FIG. 10, and FIG. 11. The data to be transmitted is supplied in the 8×8 block unit, and the first data is a DC coefficient and the second to sixty-fourth data are AC coefficients, respectively. In FIG. 8, the zigzag-order sixty-four quantized data R$_{UV}$, inputted from the input terminal 86, are inputted into the grouping unit 9 in the entropy encoding portion 6'. According to the value of the coefficient R$_{UV}$, a run-length (N) and a group number (S) are outputted to the terminal 81, and an enable signal (EN) is outputted to the terminal 82. The grouping unit 9 outputs one ZRL* code when the value of the data R$_{UV}$ continues with sixteen zeros. Since the ZRL* code is given in relation to sixty-three coefficients, omitting R$_{00}$, no more than three symbols (16×3=48) appear in one block (8×8 pixels).

The data processing unit 10 in FIG. 8 receives a run-length/group number (N/S) and an enable signal (EN), outputted from the grouping unit 9, and recognizes an effective coefficient (S) and a ZRL* code. The run-length (N) and the recognized effective coefficient (S) are transmitted to the storage device 11 as a run-length/group number (N/S). The ZRL* code recognized in the data processing unit 10 is stored temporarily in the storage device 11 and, if an EOB* code is detected after the ZRL* codes are received, the ZRL* codes are eliminated before they are encoded by the Huffman encoding portion 12 according to the write-in address signal WA. The storage device 11 deletes the ZRL* signal transmitted from the grouping unit 9 by the WA signal. The data group temporarily stored in the storage device 11 is transmitted to the Huffman encoding portion 12, as necessary, where the Huffman encoding processing is carried out.

The operation of the data processing unit 10 in FIG. 9 is explained with reference to FIG. 11, when an N/S signal having the order ( . . . AC coefficient (AC*), ZRL*, ZRL*, ZRL*, EOB* . . . ) is inputted into the input terminal 81. In FIG. 9, the signal having the order AC coefficient (AC*), ZRL*, ZRL*, ZRL*, EOB*_, inputted into the input terminal 81, is shifted by the flip-flop 17 according to a clock signal, not illustrated in FIG. 9, and outputted as an $N/S_{OUT}$ signal from the output terminal 83 to the storage device 11 in the next stage. Concurrently, an enable signal (EN), inputted into the input terminal 82, is shifted by the enable signal transmission flip-flop 21 according to the clock signal, not illustrated, as shown by EN in FIG. 11.

On the other hand, since three ZRL*s are continuously inputted from the input terminal 81 at the times t2, t3, and t4, a logical "H" continuously appears during the three clocks, i.e., the times t2, t3, and t4, on the output terminal of the ZRL* code detection circuit 13. This logical "H" is shifted by the delay adjustment flip-flop 33, and then appears at the times t3, t4, and t5 on the output Q terminal of the delay adjustment flip-flop 33.

The ZRL* code count detection counter 15 counts the output from the ZRL* code detection circuit 13. In this case, since the output from the ZRL* code detection circuit 13 becomes logical "H", continuously for three clocks, and the output ZC from the ZRL* code count detection counter 15 becomes "3" at the time t5.

In this case, an EOB* signal is inputted into the input terminal 81 at a time t5, and appears on the output terminal of the EOB* code detection circuit 14 at the same clock (t5). Accordingly, since both the output from the ZRL* code detection circuit 13 and the output from the EOB* code detection circuit 14 become logical "H" at the time t5, the two-input AND circuit 34 outputs logical "H" at the time t5 (refer "34" in FIG. 11).

A WA signal is an address signal for writing a ZRL* signal in synchronization with an $N/S_{OUT}$ signal. The first ZRL* signal corresponds to an address N in the storage device 11. The second ZRL* signal corresponds to an address N+1 in the storage device 11. The third ZRL* signal corresponds to an address N+2 in the storage device 11 (refer to $N/S_{OUT}$ and WA in FIG. 11).

FIG. 10 is a diagram showing the details of the storage device 11. The storage device 11 is constructed so that an N/S signal inputted from the input terminal 83 is written into the address of the WA signal inputted from the terminal 87. Accordingly, since the WA signal is incremented one by one, an N/S signal having the order AC coefficient (AC*), ZRL*, ZRL*, ZRL*, EOB* . . . is usually written into the addresses N−1, N, N+1, N+2, N+3, respectively.

The order of writing in the addresses in the storage device 11 is changed in the following manner, according to the output from the ZRL* code count detection counter 15. If an effective symbol comes after a ZRL* code, the address counter 36 is incremented so that a data block is written into the storage device 11 in the next stage. If an EOB* signal comes after a ZRL* signal, the count value ZC from the ZRL* code count detection counter 15 is subtracted from the count value WA outputted from the address counter 36 to obtain a resultant WD according to the output signal from the EOB* code detection circuit 13. The resultant WD is loaded in the address counter 36. Then, the ZRL* code count detection counter 15 is reset by an inverted output from the EOB* code detection circuit 14.

In this example, the EOB* code is written into the address N in the storage device 11 according to the count value ZC (3) outputted from the ZRL* code count detection counter 15 so that three unnecessary ZRL* codes, i.e., from the ZRL* code in the address N to the one preceding the EOB* code, are ignored. This has the same effect as the deletion of the ZRL* codes.

Embodiment 4

Figure 12:
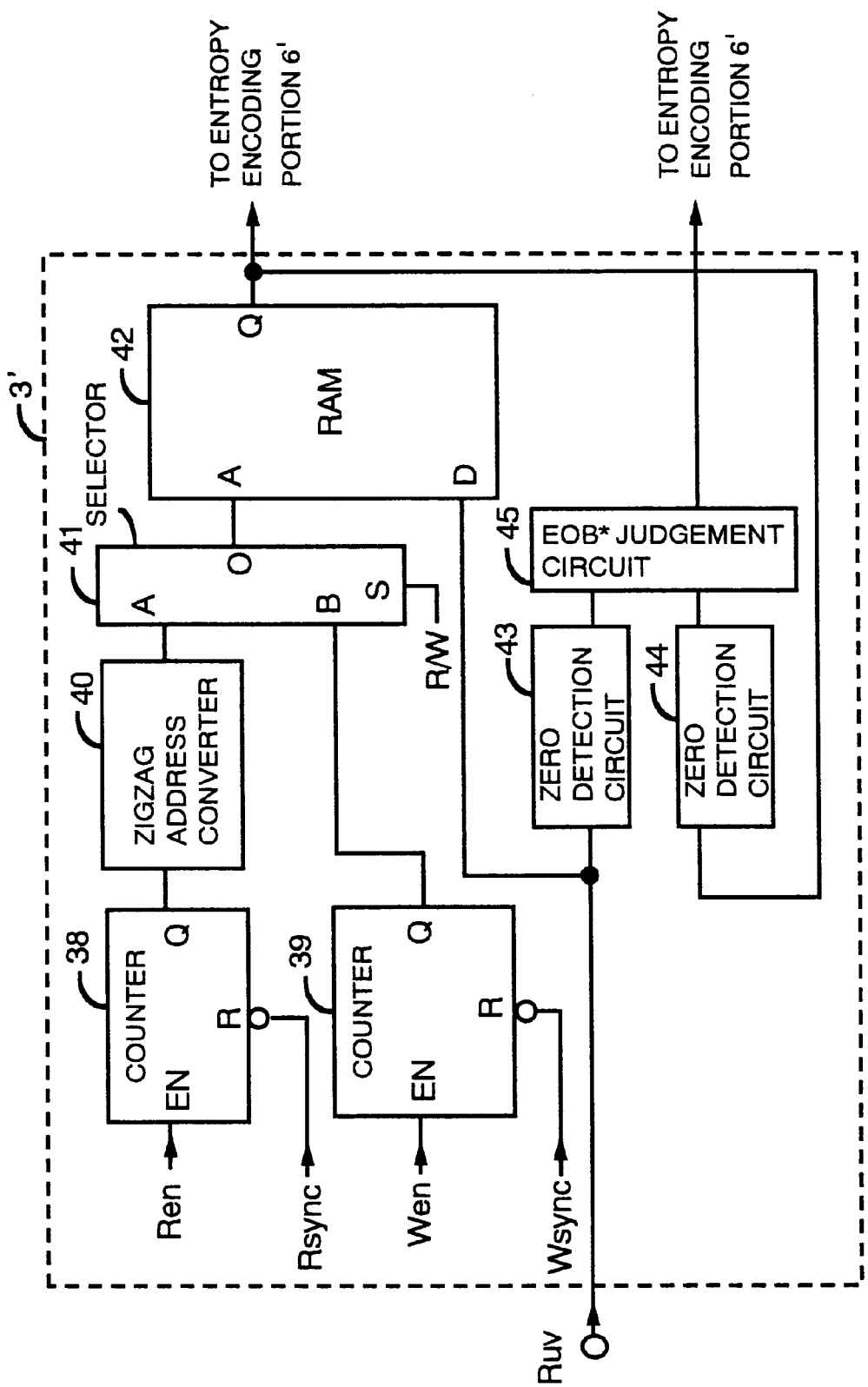
FIG. 12 is a block diagram showing the configuration of a zigzag converter in a picture encoding device according to a fourth embodiment of the present invention.
Figure 13:
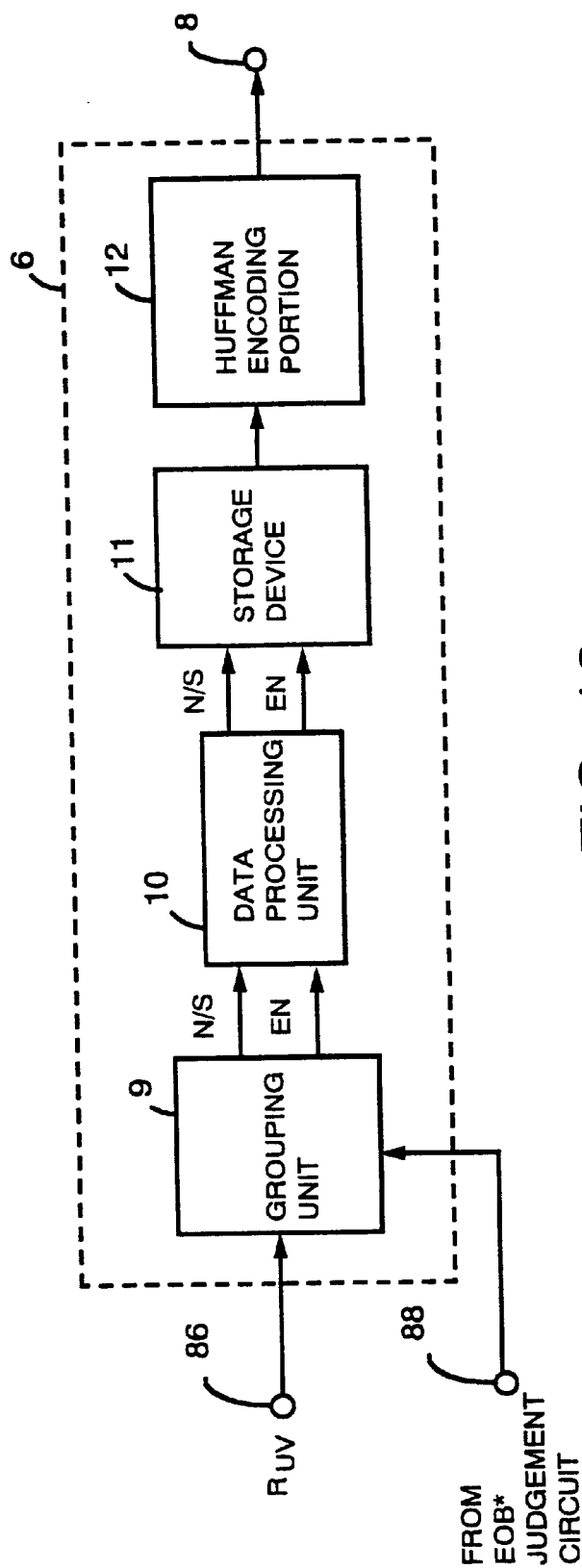
FIG. 13 is a block diagram showing the configuration of an entropy encoding portion according to fourth, fifth, and sixth embodiments of the present invention.

FIG. 12 is a block diagram showing a structure of a zigzag converter 3' in the picture encoding device according to the fourth embodiment of the present invention. FIG. 13 is a block diagram of an entropy encoding portion 6' according to the fourth, fifth, and sixth embodiments of the present invention. In FIG. 12, a counter 38 generates an address for reading out data stored in a RAM. A counter 39 generates an address for writing a data block in the RAM. A zigzag address converter 40 permutes address values in a serial order to address values in zigzag order. A selector 41 switches between the read-out address and the write-in address. A buffer RAM 42 stores temporarily a data block written in serial order in order to permute it to zigzag order. A first zero detection circuit 43 counts the number of zero data in an 8×8 block. A second zero detection circuit 44 counts the number of zero data outputted from the 8'8 block. An EOB* judgement circuit 45 detects the last effective coefficient in the 8×8 blocks from the results of the first and the second zero detection circuits 43 and 44. FIG. 13 is similar to FIG. 2, except that the grouping unit 9 is controlled by an input signal from the terminal 88 in FIG. 13.

The operation of the present embodiment is explained below. The data in every quantized 8×8 block is written into the RAM 42 in serial order in synchronization with a write synchronizing signal Wsync supplied to the counter 39. At this time, the selector 41 selects the B side. The counter 39 counts from 0 to 63, and writes a quantized 8×8 data block in serial order in the addresses 0–63 in the RAM 42. The first zero detection circuit 43 stores the number of zero data in the serial data. The selector 41 then selects the A side and the quantized 8×8 data block written into the RAM 42 is read out from the RAM 42 in zigzag order by the zigzag address converter 40 in synchronization with read-out synchronizing signal Rsync from the counter 38. The count value stored in the second zero detection circuit 44 is subtracted from the count value stored in the first zero detection circuit 43 in response to the last effective coefficient. If the resultant value is the same as the number of remaining data blocks, the EOB* judgement circuit 45 determines that the effective coefficient is the last effective coefficient in the 8×8 block, and logical "L" is sent to the grouping portion 9 of the entropy encoding portion 6 in the next stage. Receiving this logical "L" signal, the grouping unit 9 recognizes when the last effective coefficient in the block is received, and then the grouping unit 9 outputs an EOB* code. In that case, the grouping unit 9 completes the encoding processing for that block. If the grouping unit 9 receives no logical "L" signal, the grouping unit 9 outputs a ZRL* code when sixteen continuous zero data are received from the RAM 42. In that case, the grouping unit 9 continues the encoding processing.

Figure 14:
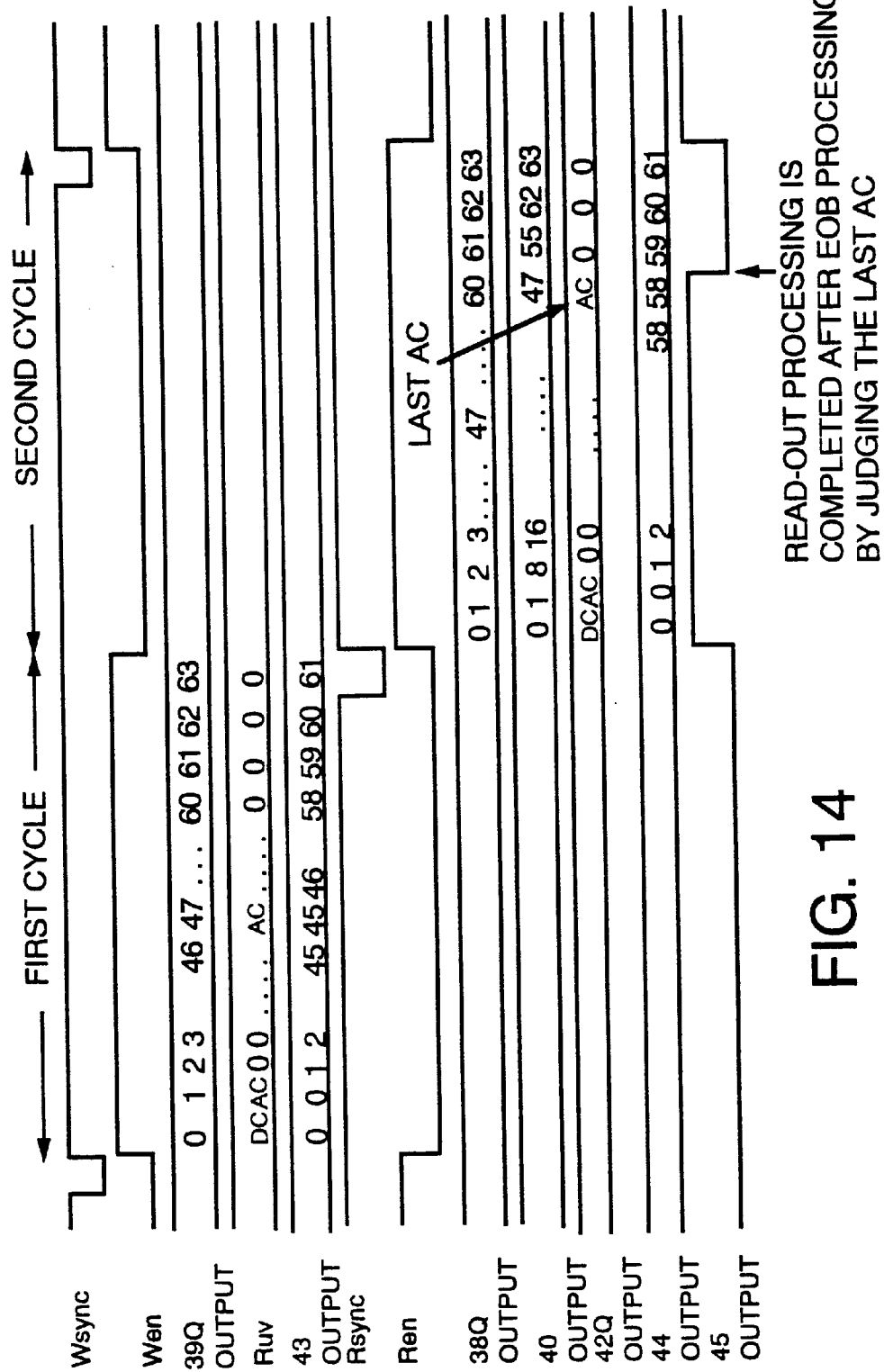
FIG. 14 is a timing chart showing an operation of a circuit according to the fourth embodiment of the present invention.

The operation is further explained when a data $R_{UV}$ at the zigzag position (5, 7) (i.e., forty-seventh in a serial order) in an 8×8 block is an effective coefficient AC, and data $R_{UV}$ at the zigzag position (7, 7) (i.e., sixty-fourth in a serial order) in an 8×8 block, is a null coefficient "0". FIG. 14 is a timing chart showing the processing of signals in the above-mentioned case.

In FIG. 14, a write-in enable signal Wen becomes logical "H" in the succeeding cycle after the write-in synchronizing signal Wsync becomes logical "L", then the selector 41 is switched to the B side at the same time when the write-in enable signal Wen becomes logical "H". An input signal $R_{UV}$ is written serially in the buffer RAM 42 in synchronization with the output Q from the second counter 39. In this example, since the input signal $R_{UV}$ is assumed to be in an order of "DC, AC, 0, 0, ..., AC, ... 0, 0, 0", the coefficients in the input signal $R_{UV}$ consist of null coefficients, except the first, second, and forty-seventh coefficients in the blocks. AC is an effective coefficient comprising any number except zero. Accordingly, the first zero detection circuit 43 counts the number of zeros after the third coefficient in the input signal $R_{UV}$. Since the input signal $R_{UV}$ consists of zeros, except the third coefficient and the forty-seventh coefficient, the first zero detection circuit 43 counts sixty-one zeros in total when the second counter 39 outputs sixty-four clock signals from its output Q, because the first, second, and forty-seventh coefficients are not counted.

Since the read-out synchronizing signal Rsync is shifted by one cycle from the write-in synchronizing signal Wsync, the read-out enable signal Ren becomes logical "H" one cycle after the read-out synchronizing signal Rsync. When the read-out enable signal Ren becomes logical "H", the first counter 38 starts its operation and generates clocks "0, 1, 2 ..., 61, 62, 63" to the output terminal 38. In synchronization with this clock, the zigzag address converter 40 outputs zigzag addresses "0, 1, 8, 16 ..., 47, 55, 62, 63". According to these zigzag addresses "0, 1, 8, 16 ..., 47, 55, 62, 63" from the zigzag address converter 40, the input signal $R_{UV}$ signal "DC, AC, 0, 0, ..., AC ..., 0, 0, 0", which is stored in the buffer RAM 42, is outputted from the output terminal Q of the buffer RAM 42. The second zero detection circuit 44 counts the number of zeros in the data outputted from the buffer RAM 42, and "0, 0, 1, 2 ..., 57, 58, 59, 60, 61" is obtained. In the EOB* judgement circuit 45, the count value 58, obtained in the second zero detection circuit 44 when the output from the buffer RAM 42 is not zero, is subtracted from the count value 61, an output of the first zero detection circuit 43. As a result, the EOB* judgement circuit 45 confirms that the number of remaining zeros appearing after the coefficient AC (5, 7) is three, and the number of the remaining data block is also three. Accordingly, the EOB* judgement circuit 45 outputs logical "L" in the next clock after the number 58 is outputted from the second zero detection circuit 44.

This logical "L" is grouped and then Huffman-encoded by the Huffman encoding portion, explained with reference to FIG. 13. FIG. 13 is a block diagram showing a structure of an entropy encoding portion according to the fourth to sixth embodiments of the present invention. In this embodiment, the logical "L" from the EOB* judgement circuit 45 is inputted in the grouping unit 9 of the entropy encoding portion 6' in the next stage, and 0/0 (EOB* code) is added to an N/S signal grouped in the grouping unit 9, which eliminates the necessity of adding the ZRL* code in the grouping unit 9 of the entropy encoding portion 6'. Accordingly, since an unnecessary ZRL* code is not dealt with as a code, the processing speed of the entropy encoding portion 6 can be increased.

Figure 15:
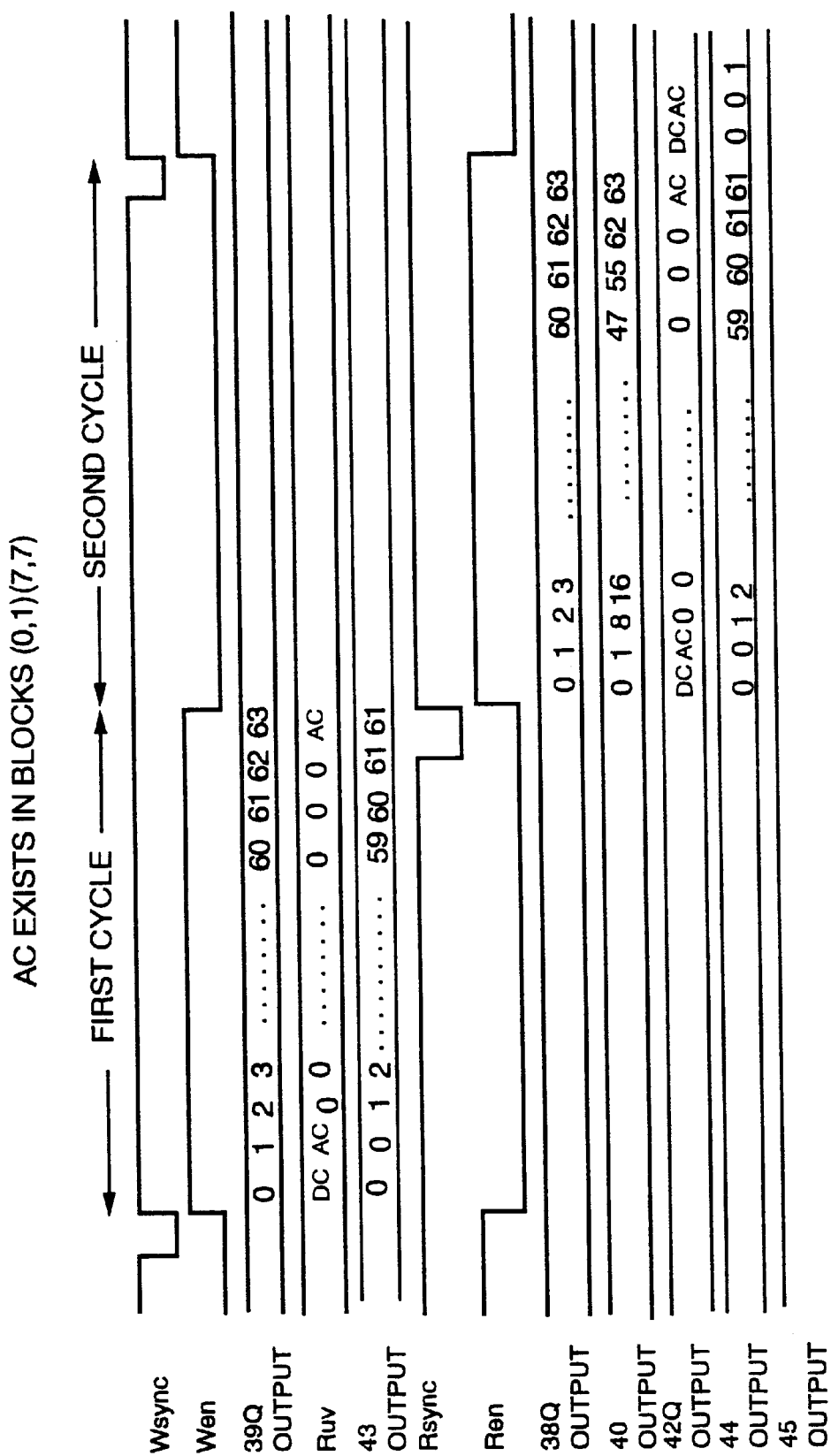
FIG. 15 is a timing chart showing an operation of a circuit according to the fourth embodiment of the present invention.

The operation is explained below for a case in which the (7, 7) data (i.e., sixty-fourth data in a serial order) in the 8×8 blocks of data $R_{UV}$ is an effective coefficient AC (but not zero). FIG. 15 is a timing chart showing signal processing in this case.

In FIG. 15, a write-in enable signal Wen becomes logical "H" in the succeeding cycle after the write-in synchronizing signal Wsync becomes logical "L". Then the selector 41 is switched to the B side at the same time when the write-in enable signal Wen becomes logical "H". An input signal $R_{UV}$ is written serially in the buffer RAM 42 in synchronization with the output Q from the second counter 39. In this example, since the input signal $R_{UV}$ is assumed to be "DC, AC, 0, 0 ..., 0 ..., 0, 0, AC", the coefficients in the input signal $R_{UV}$ consist of null coefficients, i.e., zero, except the first, second, and sixty-fourth coefficients in the blocks. AC is an effective coefficient comprising any number except zero. Accordingly, the first zero detection circuit 43 counts the number of zeros after the third coefficient in the input signal $R_{UV}$. Since the input signal $R_{UV}$ consists of zeros, except for the third coefficient and the sixty-fourth coefficient, the first zero detection circuit 43 counts sixty-one zeros in total while the second counter 39 outputs sixty-four clock signals from its output Q, because the first, second, and sixty-fourth coefficients are not counted Furthermore, since the sixty-fourth coefficient is an effective coefficient, i.e., a coefficient other than zero, the first zero detection circuit 43 does not count the value, namely, the number of zeros counted by the first zero detection circuit 43 is sixty-one.

The read-out synchronizing signal Rsync then becomes logical "L". In the next cycle, the read enable signal Ren becomes logical "H" and the selector 41 is switched to the A side at the same time. The read-out address of the output Q of the first counter 38 is converted into zigzag addresses "0, 1, 8, 16 ..., 47, 55, 62, 63" by the zigzag address converter 40. The input signal $R_{UV}$ signal having the order of "DC, AC, 0, 0 ..., 0, 0, AC", which is stored in the buffer RAM 42 according to this zigzag address from the zigzag address converter 40, is outputted. The second zero detection circuit 44 counts zeros in the data outputted from the output terminal Q of the buffer RAM 42, and obtains "0, 0, 1, 2 ..., 57, 58, 59, 60, 61, 61". In the EOB* judgement circuit 45, the count value 61, obtained in the second zero detection circuit 44 when the output from the buffer RAM 42 is AC coefficient, is subtracted from the count value 61, an output of the first zero detection circuit 43. As a result, the EOB* judgement circuit 45 confirms that the coefficient AC (5, 7) is the last effective coefficient. In this case, the output from the EOB* judgement circuit 45 does not become logical "L".

The output from the buffer RAM 42 is then grouped and Huffman encoded at the entropy encoding portion 6' in the next stage. In this case, the operation after the grouping unit 9 is the same as that of the conventional operation.

Embodiment 5

Instead of the single buffer used in the RAM portion 42 in the fourth embodiment, the buffer RAM 42 may comprise a double buffer structure consisting of an a-system and a b-system in the present embodiment. In this case, during a first cycle when an input signal $R_{UV}$ is written in serial order into a buffer RAM 42a of the a-system, a first zero detection circuit 43 counts the number of zeros for every 8×8 block. During a second cycle when the buffer is read-out in a zigzag order, the EOB* judgement circuit 45 determines the timing when a logical "L" is outputted according to the count number stored in the first zero detection circuit 43. The count number is read-out from the second zero detection circuit 44.

Figure 16:
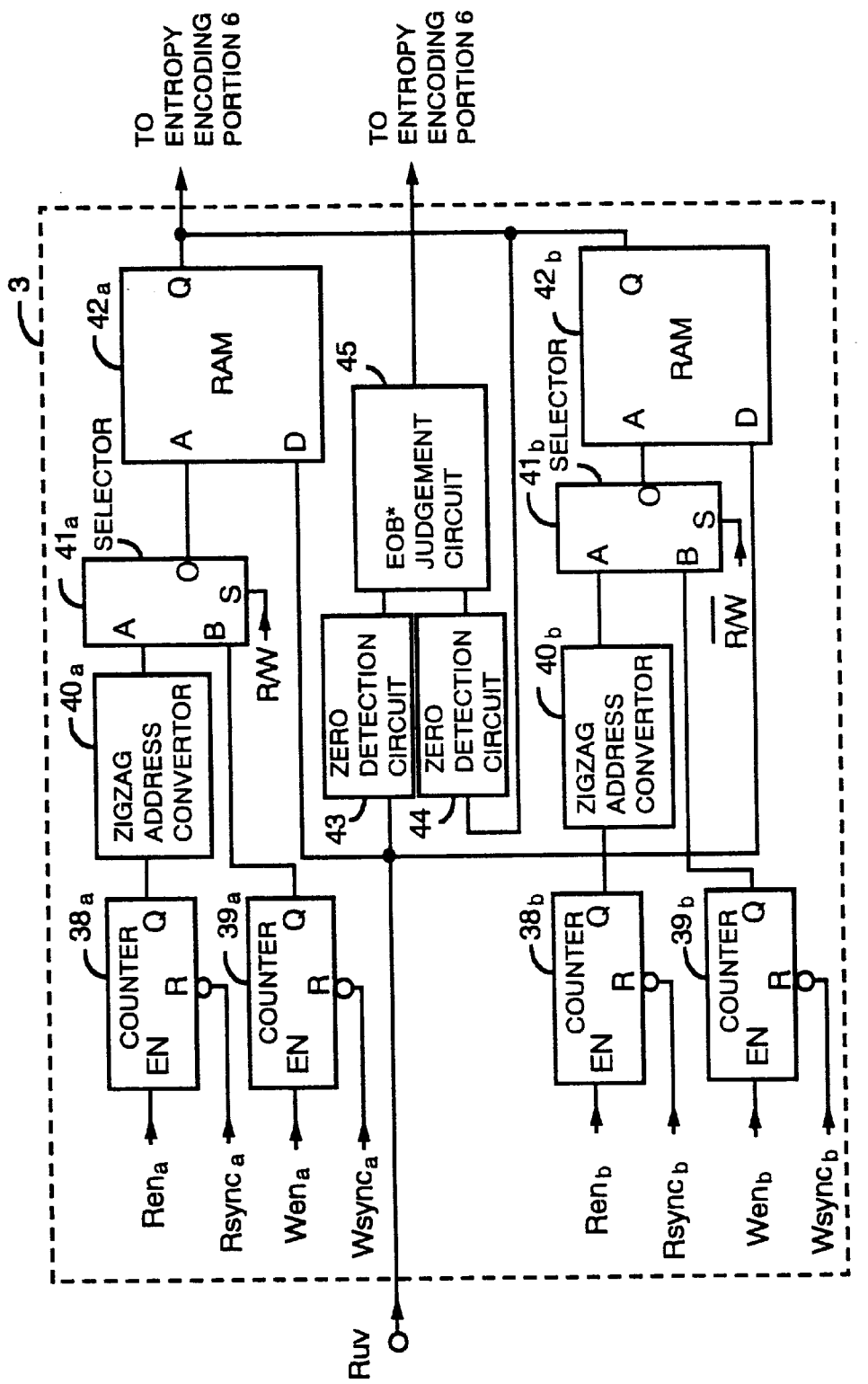
FIG. 16 is a block diagram showing the configuration of a zigzag converter in a picture encoding device according to a fifth embodiment of the present invention.

FIG. 16 is a block diagram showing a configuration of a zigzag converter 3 in the picture encoding device according to a fifth embodiment of the present invention. In FIG. 16, an a-system write-in counter 38a generates an address for reading out from a RAM, and a system zigzag address converter 40a permutes serial-order address values into zigzag order. An a-system selector 41a switches between the read-out address values and the write-in address values. An a-system buffer RAM 42a stores temporarily a data block written in serial order to permute it into zigzag order.

A b-system write-in counter 38b generates an address for reading out data from a RAM, a b-system zigzag address converter 40b permutes serial-order address values into zigzag-order ones, a b-system selector 41b switches between the read-out address values and the write-in address values, and a b-system buffer RAM 42b temporarily stores the data written in serial order before the data is permuted into zigzag order. An output from the a-system buffer RAM 42a and an output from the b-system buffer RAM 42b are coupled in parallel. A first zero detection circuit 43 counts the number of zero data in 8×8 write-in blocks. A second zero detection circuit 44 counts the number of zero data outputted from the 8×8 read-out blocks. An EOB* judgement circuit 45 determines whether the data block read-out from the a-system buffer RAM 42a and the b-system buffer RAM 42b is the last effective coefficient in the 8×8 blocks according to the respective counts by the first and the second zero detection circuits 43 and 44.

The operation of the present embodiment is explained below. The quantized data for every 8×8 block is written into the RAM 42a in serial order in synchronization with a write-in synchronizing signal $Wsync_a$ supplied to a counter 39a. At this time, the selector 41a selects the B side. The counter 39a counts from zero to sixty-three, and writes the quantized 8×8 data block in serial order for the addresses 0–63 in the RAM 42a. The first zero detection circuit 43 counts and stores the number of zero data in the serial data. The selector 41a then selects the A side and the quantized 8×8 data block written into the RAM 42a is read out from the RAM 42a in zigzag order according to the zigzag address from the zigzag address converter 40a in synchronization with a read-out synchronizing signal $Rsync_a$ from the counter 38a. The second zero detection circuit 44 then counts and stores the signal from the buffer RAM 42a.

When the data block read-out from the buffer RAM 42a is effective data, the EOB judgement circuit 45 confirms that the effective coefficient is the last coefficient in the 8×8 block, if the resultant value obtained by subtracting the count number read-out by the second zero detection circuit 44 from the count number stored in the first zero detection circuit 43 matches with the number of the remaining data. In this case, the EOB* judgement circuit 45 transmits a logical "L" to the grouping portion 9 of the entropy encoding portion 6.

During the second cycle when $Wen_b$ is logical "H", the next 8×8 data block is written in serial order into the b-system buffer RAM 42b. The first zero detection circuit 43 counts and stores the number of zeros in the serial data. The selector 41b then selects the A side and the quantized data for every 8×8 block, which is written into the RAM 42b, is read out from the RAM 42b in zigzag order according to the zigzag address from the zigzag address converter 40b, in synchronization with the read-out synchronizing signal $Rsync_b$ from the counter 38b. The second zero detection circuit 44 counts and stores the signal from the buffer RAM 42b.

When the data block read-out from the buffer RAM 42b is effective data, the EOB* judgement circuit 45 confirms that the effective coefficient is the last coefficient in the 8×8 block, if the resultant value obtained by subtracting the count number read-out by the second zero detection circuit 44 from the count number stored in the first zero detection circuit 43 matches with the number of the remaining data. In this case, the EOB* judgement circuit 45 transmits a logical "L" to the grouping portion 9 of the entropy encoding portion 6.

Receiving this logical "L" signal, the grouping unit 9 recognizes that the last effective coefficient in the block has been received and outputs an EOB* code. In that case, the grouping unit 9 completes the encoding processing for that block. If the grouping unit 9 receives no logical "L" signal, the grouping unit 9 outputs a ZRL* code when sixteen continuous zeros have been received from the RAM 42. In that case, the grouping unit 9 continues the encoding processing.

Figure 17:
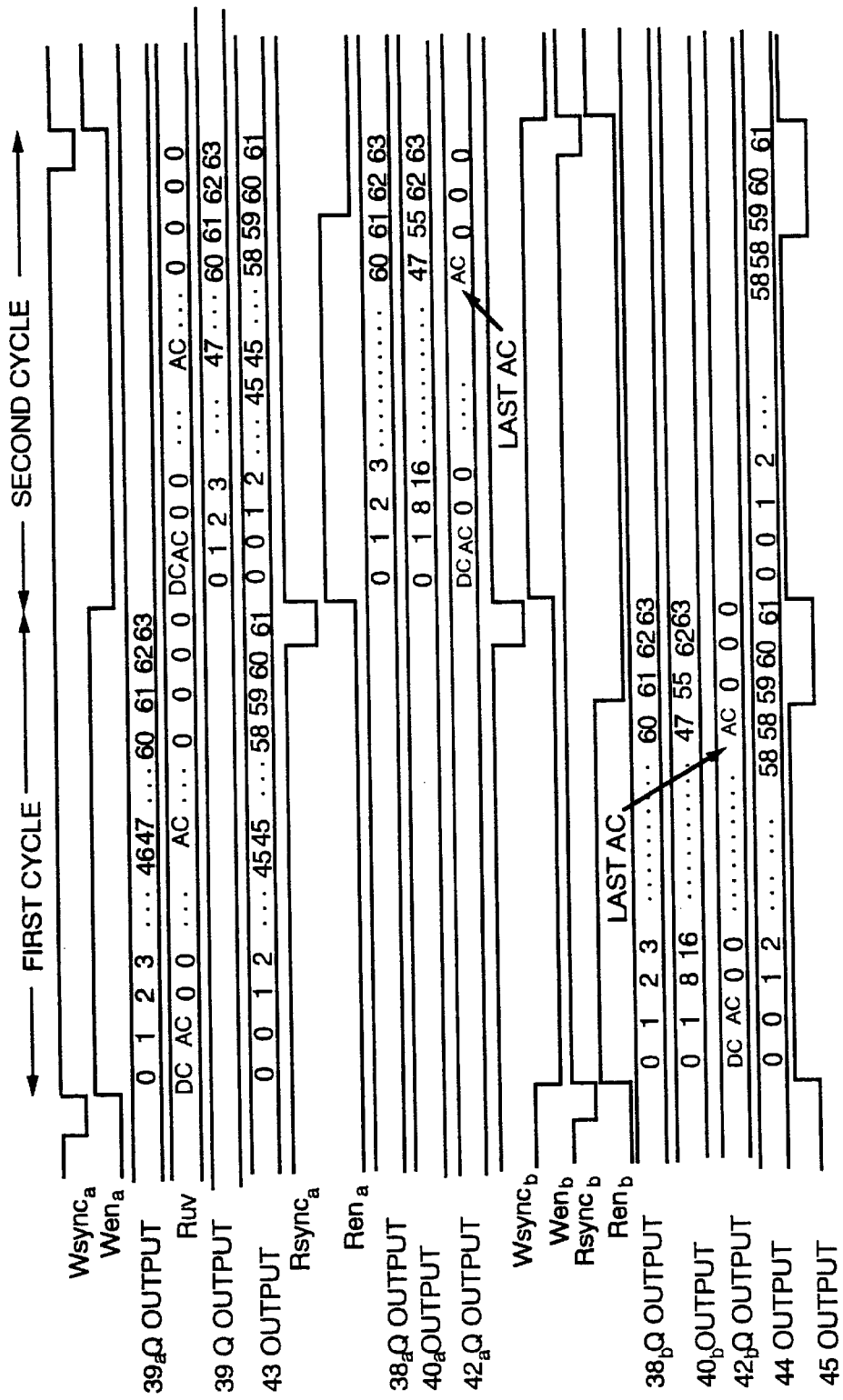
FIG. 17 is a timing chart showing an operation of a circuit according to the fifth embodiment of the present invention.

The operation is further explained for the case when data $R_{UV}$ at the zigzag position (5, 7) (i.e., forty-seventh in serial order) in an 8×8 block is an effective coefficient AC, and data $R_{UV}$ at the zigzag position (7, 7) (i.e., sixty-fourth in serial order) in an 8×8 block, is a null coefficient, "0". FIG. 17 is a timing chart showing the processing of signals in this case.

In FIG. 17, a write-in enable signal $Wen_a$ becomes logical "H" in the succeeding cycle after the write-in synchronizing signal $Wsync_a$ during the first cycle becomes logical "L". Then the selector 41a is switched to the B side at the same time the write-in enable signal Wen becomes logical "H". An input signal $R_{UV}$ is written serially in the buffer RAM 42a in synchronization with the output Q from the second counter 39a. In this example, since the input signal $R_{UV}$ is assumed to be "DC, AC, 0, 0 . . . , AC . . . , 0, 0, 0", the coefficients in the input signal $R_{UV}$ consist of null coefficients, except the first, second, and forty-seventh coefficients in the blocks. AC is an effective coefficient which comprises any number except zero. Accordingly, the first zero detection circuit 43 counts the number of zeros after the third coefficient in the input signal $R_{UV}$ except the forty-seventh one which is an AC coefficient. Accordingly, since in this example it is assumed that zero appears at a place other than the first and the forty-seventh data, the number of zeros counted by the first zero detection circuit 43 is sixty-one after sixty-four data signals are outputted from the output Q of the second counter 39a.

The read-out synchronizing signal $Rsync_a$ during the second cycle then becomes logical "L". In the next cycle, the input signal $R_{UV}$ which has been written into the buffer RAM 42a, is read out in zigzag order when the read enable signal $Ren_a$ becomes logical "H". When the read-out enable signal Rena becomes logical "H", the first counter 38a starts its operation and generates a clock "0, 1, 2 . . . , 61, 62, 63" on its output terminal 38aQ. In synchronization with this clock, the zigzag address converter 40a outputs a zigzag address "0, 1, 8, 16 . . . , 47, 55, 62, 63". The input signal $R_{UV}$ signal having the order of "DC, AC, 0, 0, 0 . . . , AC, 0, 0, 0", stored in the buffer RAM 42a, is outputted from the output terminal Q of the buffer RAM 42a, according to the zigzag address "0, 1, 8, 16 . . . , 47, 55, 62, 63", from the zigzag address converter 40a. The second zero detection circuit 44 counts zeros in the data outputted from the output terminal Q of the buffer RAM 42a, and obtains "0, 0, 1, 2 . . . , 58, 58, 59, 60, 61". In the EOB* judgement circuit 45, the count value 58, obtained in the second zero detection circuit 44 when the output from the buffer RAM 42a is an effective coefficient, is subtracted from the count value 61, a resultant value of the first zero detection circuit 43. As a result, the EOB* judgement circuit 45 confirms that the number of remaining zeros appearing after the coefficient AC (5, 7) is three, and the number of the remaining data blocks is also three. Accordingly, the EOB* judgement circuit 45 outputs logical "L" in the next clock after the number fifty-eight is outputted from the second zero detection circuit 44.

On the other hand, a write-in enable signal Wen$_b$ becomes logical "H" in the succeeding cycle after the write-in synchronizing signal Wsync$_b$ during the first cycle becomes logical "L". Then the selector 41*b* is switched to the B side when the write-in enable signal Wen$_b$ becomes logical "H". An input signal R$_{UV}$ is written into the buffer RAM 42*b* in serial order in synchronization with the output Q from the second counter 39*b*. In this example, since the input signal R$_{UV}$ is assumed to be "DC, AC, 0, 0 . . . , AC, . . . 0, 0, 0", the coefficients in the input signal R$_{UV}$ consist of null coefficients except the first, second, and forty-seventh coefficients in the blocks. AC is an effective coefficient which comprises any number except zero. Accordingly, the first zero detection circuit 43 counts the number of zeros after the third coefficient in the input signal R$_{UV}$ except the forty-seventh coefficient, an AC coefficient. Accordingly, the first zero detection circuit 43 counts sixty-one zeros in total while the second counter 39*b* outputs sixty-four clock signals from its output Q.

The read-out synchronizing signal Rsync$_b$ in the next cycle is shifted by one cycle from the write-in synchronizing signal Wsync$_b$, and the read-out enable signal Ren$_b$ becomes logical "H" one cycle after the read-out synchronizing signal Rsync$_b$ (this explanation refers to the first cycle in FIG. 17 for the convenience of the explanation). When the read-out enable signal Ren$_b$ becomes logical "H", the first counter 38*b* starts the operation and generates a clock "0, 1, 2 . . . , 61, 62, 63" on output terminal Q of the first counter 38*b*. In synchronization with this clock, the zigzag address converter 40*b* outputs a zigzag address "0, 1, 8, 16 . . . , 47, 55, 62, 63". The input signal R$_{UV}$ signal having the order of "DC, AC, 0, 0, 0 . . . AC, 0, 0, 0", stored in the buffer RAM 42*b*, is outputted, according to this zigzag address "DC, AC, 0, 0, 0 . . . AC, 0, 0, 0", from the zigzag address converter 40*b*. The second zero detection circuit 44 counts zeros in the data outputted from the output terminal Q of the buffer RAM 42*b*, and produces "0, 0, 1, 2 . . . , 58, 58, 59, 60, 61".

In the EOB* judgement circuit 45, the count value 58, which is produced by the second zero detection circuit 44 when the output from the buffer RAM 42*a* is an effective coefficient, is subtracted from the count value 61, a resultant value of the first zero detection circuit 43. As a result, the EOB* judgement circuit 45 confirms that the number of remaining zeros appearing after the coefficient AC (5, 7) is three, and the number of the remaining data blocks is also three. Accordingly, the EOB* judgement circuit 45 outputs logical "L" in the next clock after the number fifty-eight is outputted from the second zero detection circuit 44.

This logical "L" is grouped and then Huffman-encoded by the Huffman encoding portion, explained with reference to FIG. 13. In FIG. 13, the logical "L" from the EOB* judgement circuit 45 is inputted to the grouping unit 9 of the entropy encoding portion 6 in the next stage, and 0/0 (EOB* code) is added to an N/S signal, grouped in the grouping unit 9, eliminating the necessity to add the ZRL* code in the grouping unit 9 of the entropy encoding portion 6. Accordingly, since an unnecessary ZRL* code is not dealt with as a code, the processing speed of the entropy encoding portion 6 can be increased.

Figure 18:
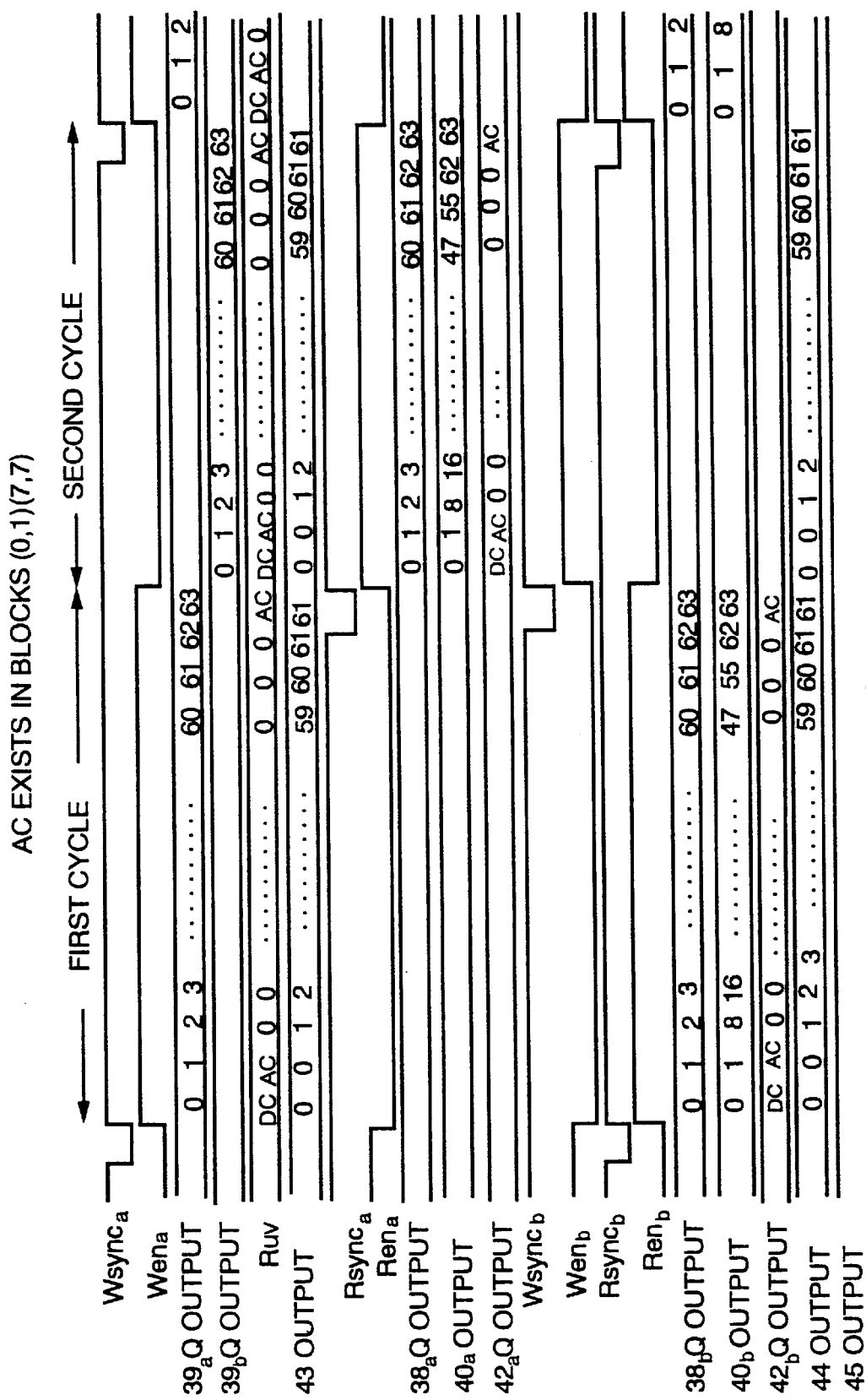
FIG. 18 is a timing chart showing an operation of a circuit according to the fifth embodiment of the present invention.

The operation is explained below for the case that the (7, 7) data (i.e., sixty-fourth data in serial order) in the 8×8 blocks of data R$_{UV}$ is an effective coefficient AC (i.e., not zero). FIG. 18 is a timing chart showing signal processing in this case.

In FIG. 18, a write-in enable signal Wen$_a$ becomes logical "H" in the succeeding cycle after the write-in synchronizing signal Wsync$_a$ becomes logical "L". Then the selector 41*a* is switched to the B side at the same time the write-in enable signal Wen$_a$ becomes logical "H". An input signal R$_{UV}$ is written serially in the buffer RAM 42*a* in synchronization with the output Q from the second counter 39. In this example, since the input signal R$_{UV}$ is assumed to be "DC, AC, 0, 0 . . . , 0 . . . , 0, 0, AC", the coefficients in the input signal R$_{UV}$ consist of null coefficients, except for the first, second, and sixty-fourth coefficients in the blocks. AC is an effective coefficient which comprises any number except zero. Accordingly, the first zero detection circuit 43 counts the number of zeros after the third coefficient in the input signal R$_{UV}$. Since the input signal R$_{UV}$ consists of zeros except for the second coefficient and the sixty-fourth coefficient, the first zero detection circuit 43 counts sixty-one zeros in total when the second counter 39*a* outputs sixty-three clock signals from its output Q, because the first, second, and sixty-fourth coefficients are not counted. Furthermore, since the sixty-fourth coefficient is an effective coefficient, i.e., a coefficient other than zero, the first zero detection circuit 43 does not count the value, namely, the number of zeros counted by the first zero detection circuit 43 is sixty-one.

The read-out synchronizing signal Rsync$_a$ becomes logical "L" during the second cycle. In the next cycle, the selector 41*a* is switched to the A side when the read enable signal Rena becomes logical "H". The read-out address of the output Q from the first counter 38*a* is converted into a zigzag address "0, 1, 8, 16 . . . 47, 55, 62, 63" by the zigzag address converter 40*a*. The input signal R$_{UV}$ signal having the order of "DC, AC, 0, 0 . . . , 0, 0, AC", stored in the buffer RAM 42*a*, according to the zigzag address from the zigzag address converter 40*a*, is outputted. The second zero detection circuit 44 counts zeros in the data outputted from the output terminal Q of the buffer RAM 42*a*, and obtains "0, 0, 1, 2 . . . , 57, 58, 59, 60, 61, 61". In the EOB* judgement circuit 45, the count value 61, which is obtained in the second zero detection circuit 44 when the output from the buffer RAM 42*a* is an AC coefficient, is subtracted from the count value 61, a resultant value of the first zero detection circuit 43. As a result, the EOB* judgement circuit 45 confirms that the coefficient AC (7, 7) is the last effective coefficient. In this case, the output from the EOB* judgement circuit 45 does not become logical "L".

On the other hand, in case of the b-system, write-in processing is carried out simultaneously with the read-out processing of the a-system, and read-out processing is carried out simultaneously with the write-in processing of the a-system during the second cycle. This operation is explained with reference to FIG. 18. In FIG. 18, a write-in enable signal Wen$_b$ becomes logical "H" in the succeeding cycle after the write-in synchronizing signal Wsync$_b$ becomes logical "L" Then the selector 41*b* is switched to the B side at the same time the write-in enable signal Wen$_b$ becomes logical "H". An input signal R$_{OUT}$ is written serially in the buffer RAM 42*b* in synchronization with the output Q from the second counter 39*b*. In this example, since the input signal R$_{UV}$ is assumed to be "DC, AC, 0, 0 . . . , 0, 0, AC", the coefficients in the input signal R$_{UV}$ consist of null coefficients, except the first, second, and sixty-fourth coefficients in the blocks. AC is an effective coefficient which comprises any number except zero. Accordingly, the first zero detection circuit 43 counts the number of zeros after the third one in the input signal $R_{UV}$. Since the input signal $R_{UV}$ consists of zeros except the second coefficient and the sixty-fourth coefficient, the first zero detection circuit 43 counts sixty-one zeros in total while the second counter 39b outputs sixty-three clock signals from its output Q, because the first, second, and sixty-fourth coefficients are not counted. Furthermore, since the sixty-fourth coefficient is an effective coefficient, i.e., a coefficient other than zero, the first zero detection circuit 43 does not count the value, namely, the number of zeros counted by the first zero detection circuit 43 is sixty-one.

The read-out synchronizing signal $Rsync_b$ then becomes logical "H". In the next cycle (the explanation refers to the first cycle in FIG. 18 for convenience), the selector 41b is switched to the A side at the same time the read enable signal $Ren_a$ becomes logical "H". The read-out address of the output Q from the first counter 38b is converted into a zigzag address "0, 1, 8, 16 . . . , 47, 55, 62, 63" by the zigzag address converter 40b. The input signal $R_{UV}$ signal having the order of "DC, AC, 0, 0 . . . , 0, 0, AC", stored in the buffer RAM 42b according to this zigzag address from the zigzag address converter 40b, is outputted. The second zero detection circuit 44 counts zeros in the data outputted from the output terminal Q of the buffer RAM 42b, and produces "0, 0, 1, 2 . . . , 57, 58, 59, 60, 61, 61".

In the EOB* judgement circuit 45, the count value 61, obtained in the second zero detection circuit 44 when the output from the buffer RAM 42b is an AC coefficient, is subtracted from the count value 61, a resultant value of the first zero detection circuit 43. As a result, the EOB* judgement circuit 45 confirms that the coefficient AC (7, 7) is the last effective coefficient. In this case, the output from the EOB* judgement circuit 45 does not become logical "L".

The output from the buffer RAM 42a and the buffer RAM 42b, coupled in parallel, is then grouped and Huffman encoded according to the Huffman encoding method by the entropy encoding portion 6' in the next stage. In this case, the operation after the grouping unit 9 is the same as that of the conventional operation.

Embodiment 6

Instead of a double buffer used in the RAM portion 42 in the fifth embodiment, the buffer RAM 42 may comprise a single buffer two-port RAM structure in the present embodiment. In this case, when write-in processing is carried out in serial order on one port of the two-port RAM (a write-in port) in a zigzag scanning portion, the number of zeros for every 8×8 block is counted. When the buffer is read out in zigzag order from the other port (a read-out port), the timing when the logical "L" is outputted is determined according to the count number of zeros in the first zero detection circuit 43 and the count number of the data block zeros in the second zero detection circuit 44. In this sixth embodiment, since the port 1 and the port 2 in the same buffer RAM 42 are used, the write-in address is shifted from the read-out address so that the same address is not accessed. In other words, the write-in cycle is always kept at a one-half cycle shift from the read-out cycle.

Figure 19:
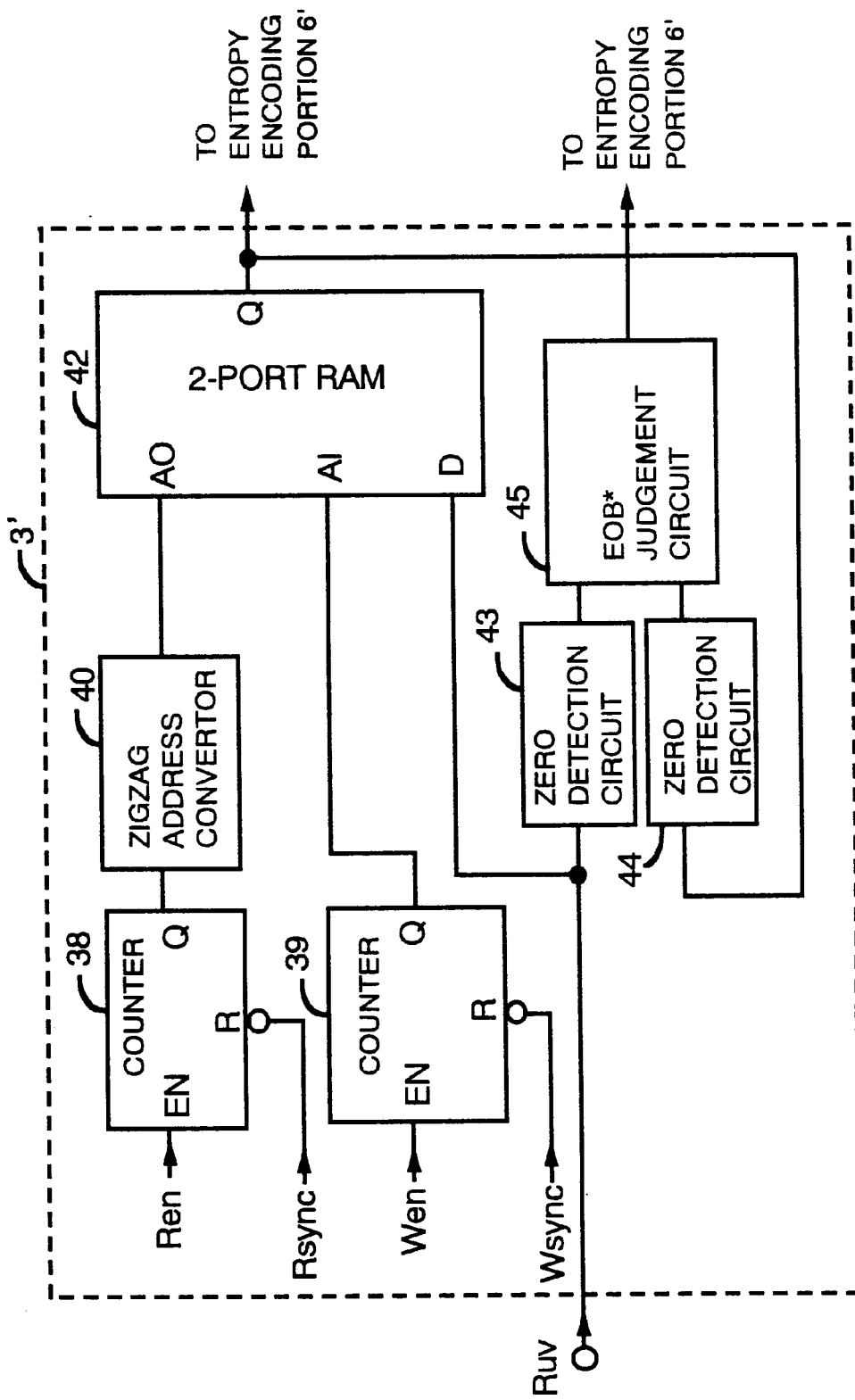
FIG. 19 is a block diagram showing the configuration of a zigzag converter in a picture encoding device according to a sixth embodiment of the present invention.

FIG. 19 is a block diagram showing a configuration of a zigzag converter in a picture encoding device according to the sixth embodiment of the present invention. In FIG. 19, the write-in counter 38 generates an address for reading out from a RAM, a zigzag address converter 40 permutes serial-order address values into zigzag-order addresses, and a buffer RAM 42 temporarily stores the data written in serial order before the data is permuted into zigzag-order. A first zero detection circuit 43 counts the number of zero data in 8×8 blocks. A second zero detection circuit counts the number of zero data outputted from the 8×8 blocks. An EOB* judgement circuit 45 determines whether the data block is the last effective coefficient in the 8×8 blocks according to the respective counts by the first and the second zero detection circuits 43 and 44.

The operation of the present embodiment is explained below. The quantized data for every 8×8 block is written into the first port of the RAM 42 in serial order in synchronization with a write-in synchronizing signal Wsync supplied to a counter 39. The counter 39 counts from zero to sixty-three, and writes the quantized 8×8 data block in serial order in the addresses 0–63 in the RAM 42. The first zero detection circuit 43 counts and stores the number of zeros in the serial data. The quantized 8×8 data block, which is written into the first port of the RAM 42, is read out from the first port of the RAM 42 in a zigzag order according to the zigzag address from the zigzag address converter 40, in synchronization with a read-out synchronizing signal Rsync, shifted one-half cycle behind from Wsync. The second zero detection circuit 44 then counts and stores the signal from the first port of the RAM 42. When an effective coefficient appears at an output of the RAM 42, the EOB* judgement circuit 45 determines whether the coefficient is the last effective coefficient according to a resultant value obtained by subtracting the count number read-out by the second zero detection circuit 44 from the count number stored in the first zero detection circuit 43. If the resultant value matches the number of remaining data blocks, the EOB* judgement circuit recognizes the coefficient as the last effective coefficient in the 8×8 block. In this case, the EOB* judgement circuit 45 transmits a logical "L" to the grouping portion 9 of the entropy encoding portion 6.

On the other hand, during the second cycle when Wen is logical "H", the next 8×8 data block is written in serial order into the second port of the buffer RAM 42. The first zero detection circuit 43 counts and stores the number of zeros in the serial data. The quantized 8×8 data block, written into the second port of the RAM 42, is read out from the RAM 42 in zigzag order according to the zigzag address from the zigzag address converter 40 in synchronization with the read-out synchronizing signal Rsync, shifted one-half cycle behind Wsync. The second zero detection circuit 44 counts and stores the signal from the buffer RAM 42.

When an effective coefficient appears at an output of the RAM 42, the EOB* judgement circuit 45 judges whether the coefficient is the last effective coefficient according to a resultant value obtained by subtracting the count number read-out by the second zero detection circuit 44 from the count number stored in the first zero detection circuit 43. If the resultant value matches with the number of the remaining data block, the EOB* judgement circuit recognizes the coefficient as the last effective coefficient in the 8×8 block. In this case, the EOB* judgement circuit 45 transmits a logical "L" to the grouping portion 9 of the entropy encoding portion 61.

Receiving this logical "L" signal, the grouping unit 9 recognizes that the last effective coefficient in the block has been received. Then, the grouping unit 9 outputs an EOB* code. In that case, the grouping unit 9 completes the encoding processing for that block. If the grouping unit 9 receives no logical "L" signal, the grouping unit 9 outputs a ZRL* code when sixteen continuous zeros are received from the RAM 42. In that case, the grouping unit 9 continues encoding processing.

Figure 20:
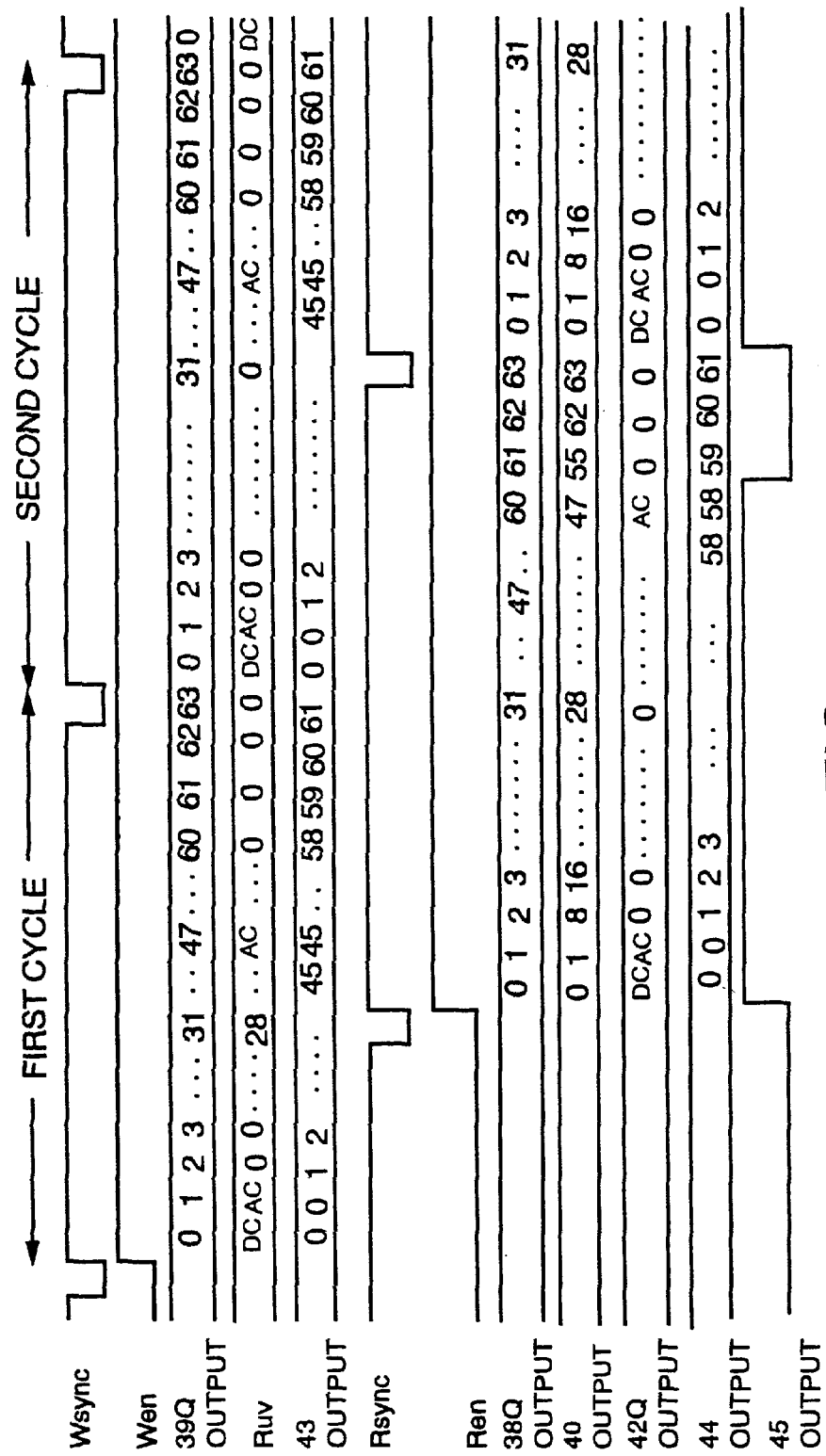
FIG. 20 is a timing chart showing an operation of a circuit according to the sixth embodiment of the present invention.

The operation is further explained when data $R_{UV}$ at the zigzag position (5, 7) (i.e., forty-seventh in serial order) in an 8×8 block is an effective coefficient AC, and a data $R_{UV}$ at the zigzag position (7, 7) (i.e., sixty-fourth in serial order) in an 8×8 block, is a null coefficient "0". FIG. 20 is a timing chart showing the processing of signals in this case.

In FIG. 20, a write-in enable signal Wen becomes logical "H" in the succeeding cycle after the write-in synchronizing signal Wsync during the first cycle becomes logical "L", at the same time the input signal $R_{UV}$ is written into the buffer RAM 42 in serial order, in synchronization with the output Q from the second counter 39. In this example, since the input signal $R_{UV}$ is assumed to be "DC, AC, 0, 0 . . . , AC . . . , 0, 0, 0", the coefficients in the input signal $R_{UV}$ consist of null coefficients, except the first, second, and forty-seventh coefficients in the blocks. AC is an effective coefficient which comprises any number except zero. Accordingly, the first zero detection circuit 43 counts the number of zeros after the third coefficient in the input signal $R_{UV}$, except the forty-seventh one, which is an AC coefficient. Accordingly, since in this example it is assumed that zero appears at each place other than the first and the forty-seventh, the number of zeros counted by the first zero detection circuit 43 is sixty-one after sixty-four data signals are outputted from the output Q of the second counter 39.

Since the read-out synchronizing signal Rsync during the first cycle is shifted by a half cycle from the write-in synchronizing signal Wsync during the first cycle, the read-out enable signal Ren becomes logical "H" one cycle after the read-out synchronizing signal Rsync. When the read-out enable signal Ren becomes logical "H", the first counter 38 starts its operation and generates a clock "0, 1, 2 . . . , 61, 62, 63" at the output terminal Q (or 38Q) of the first counter 38. In synchronization with this clock, the zigzag address converter 40 outputs a zigzag address "0, 1, 8, 16 . . . , 47, 55, 62, 63". The input signal $R_{UV}$ signal having the order of "DC, AC, 0, 0, 0 . . . , AC, 0, 0, 0", stored in the buffer RAM 42 is outputted from the output terminal Q (or 42Q) according to this zigzag address from the zigzag address converter 40. The second zero detection circuit 44 counts zeros in the data outputted from the buffer RAM 42, and produces "0, 0, 1, 2 . . . , 45, 45, 46 . . . , 57, 58, 59, 60, 61".

In the EOB* judgement circuit 45, the count value 58, which is produced by the second zero detection circuit 44 when the output from the buffer RAM 42 is an effective coefficient, is subtracted from the count value 61, a resultant value of the first zero detection circuit 43. As a result, the EOB* judgement circuit 45 confirms that the number of remaining zeros appearing after the coefficient AC (5, 7) is three, and the number of remaining data blocks is also three. Accordingly, the EOB* judgement circuit 45 outputs logical "L" in the next clock after the number fifty-eight is outputted from the second zero detection circuit 44.

A write-in enable signal Wen becomes logical "H" in the succeeding cycle after the write-in synchronizing signal Wsync during the first cycle becomes logical "L". An input signal $R_{UV}$ is written into the buffer RAM 42 in serial order in synchronization with the output Q from the second counter 39. In this example, since the input signal $R_{UV}$ is assumed to be "DC, AC, 0, 0 . . . , AC . . . , 0, 0, 0", the coefficients in the input signal $R_{UV}$ consist of null coefficients except the first, second, and forty-seventh coefficients in the data blocks. AC is an effective coefficient comprising any number except zero. Accordingly, the first zero detection circuit 43 counts the number of zeros after the third one in the input signal $R_{UV}$, except the forty-seventh one, which is AC. Since in this example zero is assumed to appear other than as the first and the forty-seventh data, the number of zeros counted by the first zero detection circuit 43 is sixty-one after the output Q of the second counter 39 outputs sixty-four data signals.

On the other hand, the read-out synchronizing signal Rsync during the second cycle is shifted by a half cycle from the write-in synchronizing signal Wsync during the second cycle. Since the read-out enable signal Ren is logical "H", the first counter 38 starts its operation and generates a clock "0, 1, 2 . . . , 61, 62, 63" at its output terminal Q (or 38Q). In synchronization with this clock, the zigzag address converter 40 outputs a zigzag address "0, 1, 8, 16 . . . , 47, 55, 62, 63". The input signal $R_{UV}$ signal having the order of "DC, AC, 0, 0, 0 . . . , AC, 0, 0, 0", stored in the buffer RAM 42, is outputted from the output terminal Q (or 42Q) according to this zigzag address from the zigzag address converter 40. The second zero detection circuit 44 counts zeros in the data outputted from the buffer RAM 42, and obtains "0, 0, 1, 2 . . . , 45, 45, 46 . . . , 57, 58, 59, 60, 61".

In the EOB* judgement circuit 45, the count value 58, produced by the second zero detection circuit 44 when the output from the buffer RAM 42 is an effective coefficient, is subtracted from the count value 61, a resultant value of the first zero detection circuit 43. As a result, the EOB* judgement circuit 45 confirms that the number of remaining zeros appearing after the coefficient AC (5, 7) is three, and the number of the remaining data block is also three. Accordingly, the EOB* judgement circuit 45 outputs logical "L" in the next clock after the number 58 is outputted from the second zero detection circuit 44.

This logical "L" is grouped and then Huffman-encoded by the Huffman encoding portion, explained with reference to FIG. 13. In FIG. 13, the logical "L" from the EOB* judgement circuit 45 is inputted in the grouping unit 9 of the entropy encoding portion 61 in the next stage, and 0/0 (EOB* code) is added to an N/S signal which is grouped in the grouping unit 9, eliminating the necessity of adding the ZRL* code in the grouping unit 9 of the entropy encoding portion 6'. Accordingly, since an unnecessary ZRL* code is not dealt with as a code, the processing speed of the entropy encoding portion 6' can be increased.

Figure 21:
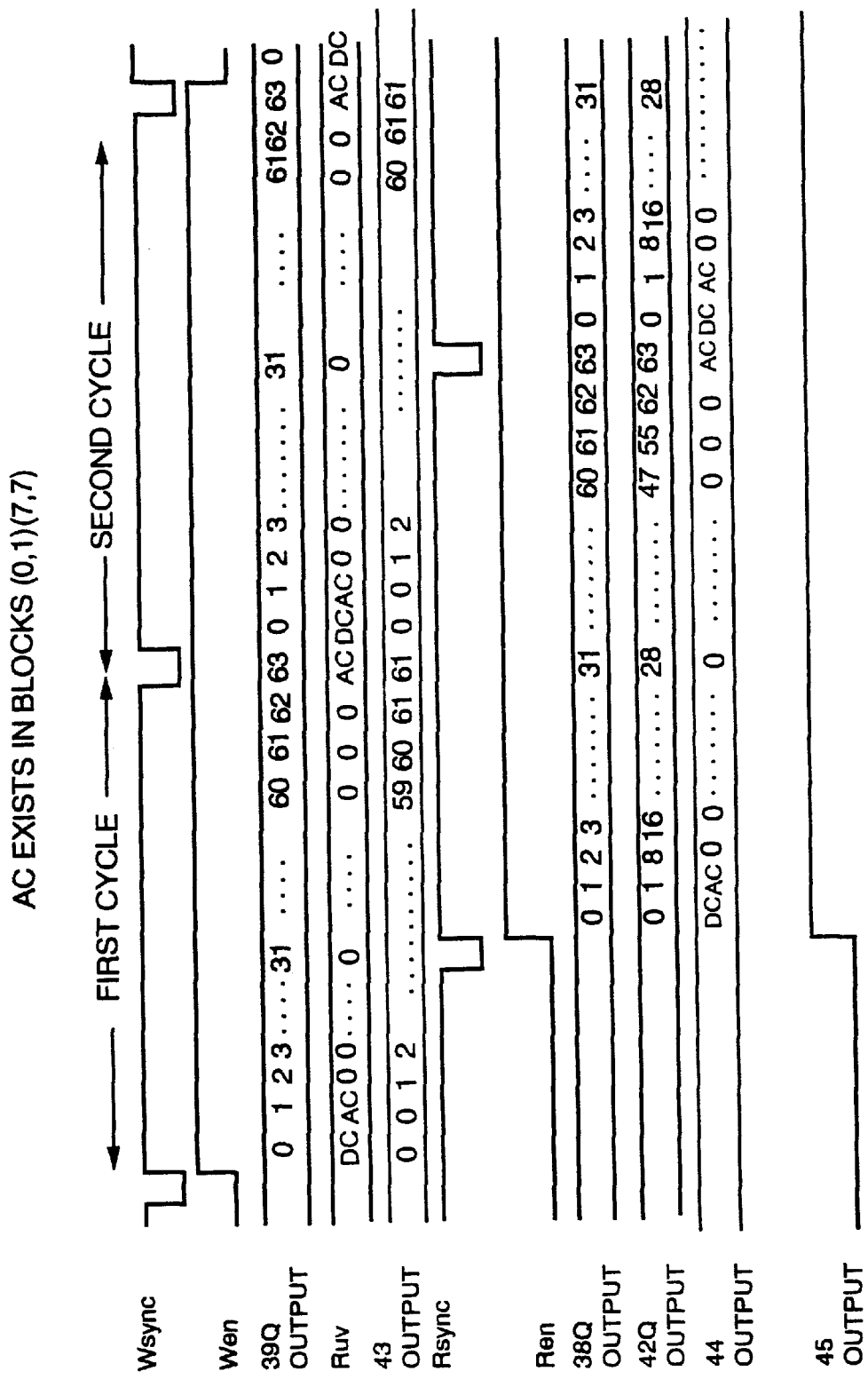
FIG. 21 is a timing chart showing an operation of a circuit according to the sixth embodiment of the present invention.

The operation is explained below for (7, 7) data (i.e., sixty-fourth data in serial order) in the 8×8 blocks of data. $R_{UV}$ is an effective coefficient AC (except 0). FIG. 21 is a timing chart showing signal processing in this case.

In FIG. 21, an input signal $R_{UV}$ is written into the buffer RAM 42 in serial order in synchronization with the output Q from the second counter 39 at the same time a write-in enable signal Wen becomes logical "H", in the following cycle after the write-in synchronizing signal Wsync becomes logical "L". In this example, since the input signal $R_{UV}$ is assumed to be "DC, AC, 0, 0 . . . , 0, 0, AC", the input signal $R_{UV}$ consists of null coefficients except the first, second, and sixty-fourth coefficients in the blocks. AC is an effective coefficient comprising any number except zero. Accordingly, the first zero detection circuit 43 counts the number of zeros after the third one in the input signal $R_{UV}$. Since the input signal $R_{UV}$ consists of zeros except the second coefficient and the sixty-fourth coefficient, the first zero detection circuit 43 counts sixty-one zeros in total while the second counter 39 outputs sixty-three clock signals from its output Q, because the first, second, and sixty-fourth coefficients are not counted. Furthermore, since the sixty-fourth coefficient is an effective coefficient, i.e., a coefficient other than zero, the first zero detection circuit 43 does not count the value. Therefore, the number of zeros counted by the first zero detection circuit 43 is sixty-one.

Since the read-out synchronizing signal Rsync during the first cycle is shifted by one-half cycle from the write-in synchronizing signal Wsync during the first cycle, the read-out enable signal Ren becomes logical "H" one cycle after the read-out synchronizing signal Rsync. When the read-out enable signal Ren becomes logical "H", the first counter 38 starts its operation and generates a clock "0, 1, 2 . . . , 61, 62, 63" at its output terminal Q (or 38Q). In synchronization with this clock, the zigzag address converter 40 outputs a zigzag address "0, 1, 8, 16 . . . , 47, 55, 62, 63". The input signal $R_{UV}$ signal having the order of "DC, AC, 0, 0 . . . , 0, 0, AC", stored in the buffer RAM 42, is outputted according to this zigzag address from the zigzag address converter 40. The second zero detection circuit 44 counts zeros in the data outputted from the output terminal Q (or 42Q) of the buffer RAM 42, and produces "0, 0, 1, 2 . . . , 57, 58, 59, 60, 61, 61".

In the EOB* judgement circuit 45, the count value 61, produced in the second zero detection circuit 44 when the output from the buffer RAM 42 is the AC coefficient, is subtracted from the count value 61, a resultant value of the first zero detection circuit 43. As a result, the EOB* judgement circuit 45 confirms that the coefficient AC (7, 7) is the last effective coefficient. In this case, the output from the EOB* judgement circuit 45 does not become logical "L".

An input signal $R_{UV}$ is written into the buffer RAM 42 in serial order in synchronization with the output Q from the second counter 39 at the same time a write-in enable signal Wen becomes logical "H", in the following cycle after the write-in synchronizing signal Wsync becomes logical "L". In this example, since the input signal $R_{UV}$ is assumed to be "DC, AC, 0, 0 . . . , 0, 0, AC", the input signal $R_{UV}$ consists of null coefficients, except the first, second, and sixty-fourth coefficients in the blocks. AC is an effective coefficient comprising any number except zero. Accordingly, the first zero detection circuit 43 counts the number of zeros after the third one in the input signal $R_{UV}$. Since the input signal $R_{UV}$ consists of zeros, except the second coefficient and the sixty-fourth coefficient, the first zero detection circuit 43 counts sixty-one zeros in total while the second counter 39 outputs sixty-three clock signals from its output Q, because the first, second, and sixty-fourth coefficients are not counted. Furthermore, since the sixty-fourth coefficient is an effective coefficient, i.e., a coefficient other than zero, the first zero detection circuit 43 does not count the value. Thus, the number of zeros counted by the first zero detection circuit 43 is sixty-one.

Since the read-out synchronizing signal Rsync during the second cycle is shifted from the write-in synchronizing signal Wsync during the second cycle by a half cycle, the read-out enable signal Ren becomes logical "H" one cycle after the read-out synchronizing signal Rsync. When the read-out enable signal Ren becomes logical "H", the first counter 38 starts its operation and generates a clock "0, 1, 2 . . . , 61, 62, 63" at its output terminal Q (or 38Q). In synchronization with this clock, the zigzag address converter 40 outputs a zigzag address "0, 1, 8, 16 . . . , 47, 55, 62, 63". The input signal $R_{UV}$ signal having the order of "DC, AC, 0, 0 . . . , 0, 0, AC", stored in the buffer RAM 42, is outputted according to this zigzag address from the zigzag address converter 40. The second zero detection circuit 44 counts zeros in the data outputted from the output terminal Q (or 42Q) of the buffer RAM 42, and produces "0, 0, 1, 2 . . . , 57, 58, 59, 60, 61, 61".

The EOB* judgement circuit 45 recognizes that the AC (7, 7) is the last effective coefficient by subtracting the count number 61, the result which the second zero detection circuit 44 counts when the output from the buffer RAM 42a is an AC coefficient, from a numerical value sixty-one, the result being outputted from the first zero detection circuit 43. In this case, the output from the EOB* judgement circuit 45 does not become logical "L".

The output from the buffer RAM 42 is then grouped and Huffman encoded according to the Huffman encoding method by the entropy encoding portion 6' in the next stage. In this case, the operation after the grouping unit 9 is the same as that of the conventional operation. half cycle, the read-out enable signal Ren becomes logical "H" one cycle after the read-out synchronizing signal Rsync. When the read-out enable signal Ren becomes logical "H", the first counter 38 starts its operation and generates a clock "0, 1, 2 . . . , 61, 62, 63" at its output terminal Q (or 38Q). In synchronization with this clock, the zigzag address converter 40 outputs a zigzag address "0, 1, 8, 16 . . . , 47, 55, 62, 63". The input signal $R_{UV}$ signal having the order of "DC, AC, 0, 0 . . . , 0, 0, AC", stored in the buffer RAM 42, is outputted according to this zigzag address from the zigzag address converter 40. The second zero detection circuit 44 counts zeros in the data outputted from the output terminal Q (or 42Q) of the buffer RAM 42, and produces "0, 0, 1, 2 . . . , 57, 58, 59, 60, 61, 61".

The EOB* judgement circuit 45 recognizes that the AC (7, 7) is the last effective coefficient by subtracting the count number 61, the result which the second zero detection circuit 44 counts when the output from the buffer RAM 42a is an AC coefficient, from a numerical value sixty-one, the result being outputted from the first zero detection circuit 43. In this case, the output from the SOB* judgement circuit 45 does not become logical "L".

The output from the buffer RAM 42 is then grouped and Huffman encoded according to the Huffman encoding method by the entropy encoding portion 6' in the next stage. In this case, the operation after the grouping unit 9 is the same as that of the conventional operation.

What is claimed is:

1. A picture encoding device for compressing picture data comprising:
   a cosine conversion portion for carrying out a discrete cosine conversion for every pixel block of picture data,
   a quantization portion for carrying out a linear quantization on a discrete-cosine-converted coefficient with a step size corresponding to a position of the coefficient,
   a zigzag conversion portion for permuting serial-order block data into zigzag-order data, and
   an entropy encoding portion comprising
      a grouping portion for determining which group a permuted AC coefficient value belongs to, said entropy encoding portion carrying out entropy encoding using Huffman encoding according to a run-length, a group number, and an additional bit, which are output by said grouping portion, and
      a data processing unit, said data processing unit comprising a ZRL* code detection circuit for detecting a ZRL* code, an EOB* code detection circuit for detecting an EOB* code, a ZRL* code count detection counter for counting ZRL* codes detected in said ZRL* code detection circuit, data-transmission storage devices, enable-signal-transmission storage devices, a decoder for generating a control signal from a value of said ZRL* code count detection counter, and a plurality of three-input logic circuits and a two-input AND circuit, said two-input AND circuit being provided an output from said EOB* code detection circuit and an output from said ZRL* code detection circuit delayed by one clock cycle, and said three-input logic circuits are provided a corresponding output from said decoder and an output from said two-input AND circuit, wherein,
if run-length/group number (N/S) is an effective symbol i.e., not a ZRL* code, the effective symbol is transmitted to a Huffman encoding portion in the next stage via said data-transmission storage devices,
if the N/S comprises a ZRL* code, said ZRL* code detection circuit increments said ZRL* code count detection counter,
if the ZRL* code is followed by an EOB* code, ZRL* codes are deleted in a number corresponding to a count value of said ZRL* code count detection counter,
if N/S comprises a ZRL* code, said decoder decodes the number of ZRL* codes incremented by said ZRL* code detection circuit and ZRL* codes stored in said data transmission storage devices, corresponding to the decoded value, are deleted, and,
if the N/S comprises more than one ZRL* code and the EOB* code, the number of the ZRL* codes incremented by said ZRL* code detection circuit is decoded in the decoder, a signal corresponding to the decoded value and an out-put from said two-input AND circuit are input to said three-input logic circuits, and said data-transmission-storage devices and said enable-signal-transmission storage devices are reset in response to an output from said three-input logic circuits, whereby the ZRL* codes input before the EOB* code are deleted.

2. A picture encoding device for compressing picture data comprising:
a cosine conversion portion for carrying out a discrete cosine conversion for every pixel block of picture data,
a quantization portion for carrying out a linear quantization on a discrete-cosine-converted coefficient with a step size corresponding to a position of the coefficient,
a zigzag conversion portion for permuting serial-order block data into zigzag-order data, and
an entropy encoding portion comprising
a grouping portion for determining which group a permuted AC coefficient value belongs to, said entropy encoding portion carrying out entropy encoding using Huffman encoding according to a run-length, a group number, and an additional bit, which are output by said grouping portion, and
a data processing unit, said data processing unit comprising a ZRL* code detection circuit for detecting a ZRL* code, an EOB* code detection circuit for detecting an EOB* code, a ZRL* code count detection counter for counting ZRL* codes detected in said ZRL* code detection circuit, data-transmission storage devices, enable-signal-transmission storage devices, wherein,
if run-length/group number (N/S) is an effective symbol i.e., not a ZRL* code, the effective symbol is transmitted to a Huffman encoding portion in the next stage via said data-transmission storage devices,
if the N/S comprises a ZRL* code, said ZRL* code detection circuit increments said ZRL* code count detection counter, and
if the ZRL* code is followed by an EOB* code, ZRL* codes are deleted in a number corresponding to a count value of said ZRL* code count detection counter,
said entropy encoding portion further comprises an address control unit, and a storage device coupled between said data processing unit and the Huffman encoding portion; and
said address control unit writes an EOB* code into an address in said storage device, the address being determined by subtracting the number of ZRL* codes detected in said ZRL* code count detection circuit from the current address, whereby the ZRL* codes are deleted.

3. The picture encoding device according to claim 2, wherein said address control unit comprises an address counter and a subtractor and, if the N/S comprises ZRL* codes, said address counter and said subtractor subtracting a count value of said ZRL* code count detection counter from a write-in address WA in said storage device, whereby the ZRL* code to be stored in said storage device is replaced by the EOB* code, and the ZRL* code is deleted.

4. The picture encoding device according to claim 3, wherein said address control unit further comprises a first delay-adjustment flip-flop for delaying a ZRL* code, a second delay-adjustment flip-flop for delaying an output of said ZRL* code count detection counter, and a two-input AND circuit and, if an output of said two-input AND circuit is logical "H", said two-input AND circuit is provided two signals, one signal being produced by delaying an output of said ZRL* code detection circuit by said first delay-adjustment flip-flop, and another signal output by said EOB* code detection circuit, and said address counter and said subtractor decrement the write-in address WA in said storage device by the count value from said ZRL* code count detection counter, whereby the ZRL* code to be stored in said storage device is replaced by the EOB* code, and the ZRL* code is deleted.

5. A picture encoding device for compressing picture data comprising:
a cosine conversion portion for carrying out a discrete cosine conversion for every pixel block of picture data,
a quantization portion for carrying out a linear quantization on a discrete-cosine-converted coefficient with a step size corresponding to a position of the coefficient,
a zigzag conversion portion for permuting serial-order block data into zigzag-order data, and
an entropy encoding portion comprising
a grouping portion for determining which group a permuted AC coefficient value belongs to, said entropy encoding portion carrying out entropy encoding using Huffman encoding according to a run-length, a group number, and an additional bit, which are output by said grouping portion, and
a data processing unit, said data processing unit comprising a ZRL* code detection circuit for detecting a ZRL* code, an EOB* code detection circuit for detecting an EOB* code, a ZRL* code count detection counter for counting ZRL* codes detected in said ZRL* code detection circuit, data-transmission storage devices, enable-signal-transmission storage devices, wherein,
if run-length/group number (N/S) is an effective symbol i.e., not a ZRL* code, the effective symbol is transmitted to a Huffman encoding portion in the next stage via said data-transmission storage devices,
if the N/S comprises a ZRL* code, said ZRL* code detection circuit increments said ZRL* code count detection counter, and if the ZRL* code is followed by an EOB* code, ZRL* codes are deleted in a number corresponding to a count value of said ZRL* code count detection counter, said zigzag conversion portion comprises a buffer, a write-in counter for generating an address for writing a block of data in said buffer, a read-out counter for generating an address for reading out from said buffer, a zigzag address converter for converting serial-order values of said read-out counter into zigzag-order values, a selector for switching between a read-out address and a write-in address of said buffer, a first zero detection circuit for detecting the number of zero data to be written into said buffer, a second zero detection circuit for detecting the number of zero data to be read out from said buffer, and an EOB* judgement circuit for detecting a last effective coefficient in a pixel block in response to numbers in said first and second zero detection circuits; and the number of zero data in the pixel block when block data is written into said buffer in serial order is compared to the number of zero data in the pixel block when the data is read out from said buffer in zigzag order, and, if the compared result matches the number of block data remaining in said buffer, a signal which indicates that an output code from said buffer is a last efficient coefficient in the pixel block is output.

6. The picture encoding device according to claim 5, wherein said buffer comprises a two port buffer, wherein written-in pixel block data is read out in zigzag order from a second port of said two port buffer when the block data of the pixel block is written in through a first port of said two port buffer in a serial order during a first cycle, and written-in pixel block data is read out in zigzag order from said first port of said two port buffer when the block data of the pixel block is written in through said second port of said two port buffer in a serial order during a second cycle; and the number of zero data in the pixel block when block data is written into said two port buffer in serial order are compared with the number of zero data in the pixel block when the data is read out from said two port buffer in a zigzag order, and, if the compared result matches the number of block data remaining in said two port buffer, a signal which indicates that an output code from said two port buffer is the last efficient coefficient in said pixel block is output from each corresponding port.

7. The picture encoding device according to claim 6, wherein said first zero detection circuit counts the number of zero data in each pixel block during a first cycle when block data is written into said first port of said two port buffer in serial order during the first cycle, and said first zero detection circuit also counts the number of zero data in each pixel block during the second cycle when block data is written into said second port of said two port buffer in serial order during the second cycle;

said second zero detection circuit counts the number of zero data when content at said first port is read out in zigzag order during a cycle which is shifted one-half cycle from the first cycle, and said second zero detection circuit also counts the number of zero data when content at said second port is read out in zigzag order during a cycle which is shifted one-half cycle from the second cycle; and said EOB* judgement circuit compares the number of zero data counted in said first zero detection circuit with the number of zero data in the pixel block when the data is read out in zigzag order from said two port buffer, and if the compared result coincides with the number of block data remaining in said two port buffer, said EOB* judgement circuit outputs a signal which indicates that an output code from said two port buffer is the last efficient coefficient in the pixel block from each corresponding port.

8. The picture encoding device according to claim 5, wherein said first zero detection circuit counts the number of zero data in every pixel block when the block data is serially written into said buffer, said second zero detection circuit counts the number of zero data when the contents of the buffer are read out in a zigzag order, said EOB* judgement circuit compares the number of zero data counted in said first zero data detection circuit with the number of zero data counted in said second zero detection circuit and, if the compared result matches the number of block data remaining in said buffer, said EOB* judgement circuit outputs a signal which indicates that an output code from said buffer is the last efficient coefficient in the pixel block.

9. The picture encoding device according to claim 5, wherein said buffer, said write-in counter for generating an address value to write block data in said buffer, said read-out counter for generating an address value to read out from said buffer, said zigzag address converter for converting serial-order values of said read-out counter into zigzag-order values, said selector for switching between a read-out address and a write-in address of said buffer are duplicated, respectively;

said first zero detection circuit for detecting the number of zero data to be read written into said buffer, said second zero detection circuit for detecting the number of zero data to be read out from said buffer, and said EOB* judgement circuit for detecting a last effective coefficient in the pixel block in response to the numbers of said first zero detection circuit and said second zero detection circuit are shared, and outputs from duplicated buffers, namely from first and second buffers, are connected in common, and block data is read our from said second buffer in a zigzag order when block data is written into said first buffer in serial order, and block data is read out from said first buffer in zigzag order when block data is written into said second buffer in serial order; and the number of zero data in the pixel block while block data is written into a respective one of said buffers in a serial order and the number of zero data is the pixel block when the data is read out from said respective buffer in zigzag order are compared and, if the compared result matches the number of block data remaining in said buffer, each duplicated circuit independently outputs a signal which indicates that an output code from said respective buffer is the last efficient coefficient in the pixel block.

10. The picture encoding device according to claim 9, wherein said first zero detection circuit counts the number of zero data in every pixel block during a first cycle when block data is serially written into said first buffer during a first cycle, and said first zero detection circuit also counts the number of zero data in every pixel block during a second cycle when block data is written into said second buffer in serial order during a second cycle;

said second zero detection circuit counts the number of zero data read out from said second buffer when content of said second buffer is read out during the first cycle, and said second zero detection circuit also counts the number of zero data read out from said first buffer when content of said first buffer is read out in zigzag order during a second cycle; and said EOB* judgement circuit compares the number of zero data counted in said first zero detection circuit with the number of zero data counted in said second zero detection circuit and, if the compared result matches the number of block data remaining in said buffer, said EOB* judgement circuit outputs a signal which indicates that an output code from said buffer is the last efficient coefficient in the pixel block.

* * * * *